United States Patent
Wargo et al.

(10) Patent No.: US 8,092,730 B2
(45) Date of Patent: Jan. 10, 2012

(54) MOLDED ROTATABLE BASE FOR A POROUS PAD

(75) Inventors: Christopher Wargo, Wellesley, MA (US); Thomas LeBlanc, Mendon, MA (US)

(73) Assignee: Entegris, Inc., Billerica, MA (US)

( * ) Notice: Subject to any disclaimer, the term of this patent is extended or adjusted under 35 U.S.C. 154(b) by 662 days.

(21) Appl. No.: 12/095,775

(22) PCT Filed: Nov. 21, 2006

(86) PCT No.: PCT/US2006/045090
§ 371 (c)(1),
(2), (4) Date: Jun. 2, 2008

(87) PCT Pub. No.: WO2007/067348
PCT Pub. Date: Jun. 14, 2007

(65) Prior Publication Data
US 2009/0044830 A1 Feb. 19, 2009

Related U.S. Application Data

(60) Provisional application No. 60/742,641, filed on Dec. 6, 2005, provisional application No. 60/819,605, filed on Jul. 10, 2006.

(51) Int. Cl.
*B29C 45/17* (2006.01)
*C08J 9/06* (2006.01)

(52) U.S. Cl. ............... 264/54; 264/239; 15/102
(58) Field of Classification Search ............ 15/102; 264/239, 54
See application file for complete search history.

(56) References Cited

U.S. PATENT DOCUMENTS

| | | | |
|---|---|---|---|
| 2,563,048 A | 8/1951 | Liebelt et al. | |
| 4,098,728 A | 7/1978 | Rosenblatt | |
| 4,820,580 A | 4/1989 | Hocker et al. | |
| 5,045,889 A | 9/1991 | Hoover | |
| 5,087,514 A | 2/1992 | Graefe | |
| 5,284,468 A | 2/1994 | Nelson | |
| 5,466,231 A | 11/1995 | Cercone et al. | |
| 5,524,642 A | 6/1996 | Rosenblatt | |
| 5,736,089 A | 4/1998 | Stefani | |
| 5,853,649 A | 12/1998 | Tisack et al. | |
| 6,240,588 B1 | 6/2001 | Dickey et al. | |
| 6,247,197 B1 | 6/2001 | Vail et al. | |
| 6,467,120 B1 * | 10/2002 | Ziemins et al. | 15/102 |
| 6,830,782 B2 | 12/2004 | Kanazawa | |
| 2002/0020434 A1 | 2/2002 | McMullen et al. | |
| 2002/0042331 A1 * | 4/2002 | Fortner et al. | 492/13 |

\* cited by examiner

*Primary Examiner* — Randall Chin
(74) *Attorney, Agent, or Firm* — Patterson Thuente Christensen Pedersen, P.A.

(57) ABSTRACT

A rotatable base for a porous pad has openings that provide for improved flow distribution of a liquid in the base across a substrate. The rotatable base can be molded from a two piece mold and the openings can have draft angles to facilitate the molding process.

3 Claims, 12 Drawing Sheets

MOLDED ROTATABLE BASE FOR A POROUS PAD

This application claims the benefit of U.S. Provisional application No. 60/742,641 filed Dec. 6, 2005, and U.S. Provisional application No. 60/819,605 filed Jul. 10, 2006, the contents of these applications incorporated by reference in their entirety into the present application.

Uniform fluid distribution across a substrate during cleaning, coating, or etching processes can improve particle removal from the substrate during a cleaning process, improve the uniformity of a film applied across the substrate in a coating operation, or improve the uniformity of film layer removal from the substrate in an etching process. A rotatable base or brush core with a foam brush overlying the rotatable base or brush core can be used to distribute fluid across a substrate.

In making a rotatable base for a porous pad, and especially where the base has a high ratio of open surface area per area of base supporting the pad, exposure of the base to high temperatures in an injection molding process or during a post molding machining process can result in a loss of dimensional tolerances or dimensional stability of the rotatable base. There is a need for inexpensive, lightweight, dimensionally stable rotatable base parts that retain dimensional stability during molding and finishing operations. There is a need for inexpensive, lightweight, dimensionally stable rotatable base parts that support a porous pad, the pad being interlocked with one or more voids in the base where the base exhibits dimensional stability during use to clean substrates such as wafers or flat panel displays.

Embodiments of the invention include a rotatable base or rotatable brush core and a method for making the rotatable base or brush core that can be used with an overlying sponge brush or other foam material in substrate scrubbing, cleaning, or coating operations. The substrate can be any substrate that may need to undergo such an operation to complete a cleaning operation, coating, etching operation, or other substrate surface preparation. For instance, the substrate can be a semiconductor wafer, a disk, flat panel, or any other type of work piece that will benefit from a rotatable base that can deliver uniform controlled amounts of fluid through the brush material along a portion or an entire length of the rotatable base. The rotatable base or brush core has a center bore or conduit having a length that extends between a first end and a second end. The first end has an opening into the bore, the bore is defined by an inner surface of the rotatable base which extends along an inner length of the bore. The openings fluidly connect the inner and outer surfaces of the rotatable base and the openings can have an axis that is approximately or substantially parallel to the radial separation axis of the mold plate(s) that formed the openings, the radial separation axis of the mold plate essentially bisects the mold plate. In some embodiments the rotatable base includes a plurality openings that each have an axis that is approximately or substantially parallel to the z-axis of the plane that divides the rotatable base into two half cylindrical shells or portions, the plane includes the rotational axis of the rotatable base or brush core. The openings in the rotatable base can be oriented along one half cylindrical shell portion of the base while a second plurality of holes can be oriented along the second half cylindrical shell portion of the base. The holes or openings in each half shell provide fluid flow communication between the inner surface or bore of the rotatable base and an outer surface of the rotatable base.

In some embodiments of the invention, the openings in the rotatable base or brush core can be partially or completely filled with a foam or sponge like porous material that can comprise or form the brush overlying the rotatable base or brush core. In some embodiments the porous material forms a channel or core within the bore of the rotatable base or brush core that distributes liquid along the length of the rotatable base or brush core. In other embodiments the brush overlying the base interlocks with the rotatable base by mechanical bonding, adhesion, chemical bonding, or any combination of these.

In some embodiments the rotatable base or brush core is formed from a molded non-porous thermoplastic material with closed cell structure. The rotatable base or brush core can have a high opening area per area in contact with the brush or a high ratio of open void volume to volume of rotatable base. In some embodiments, a blowing agent provides rigidity to high void volume base and/or provides a bonding surface for a porous pad or foam cast onto one or more surfaces of the rotatable base.

One embodiment of the invention is a rotatable base for a porous pad where the rotatable base has one or more openings for fluid to flow from the inside of the rotatable base through a porous pad on the outside of the rotatable base. The openings between the inner and outer surfaces of the rotatable base can be divided into one or more groups of openings, each group of openings lie within an arc described by the outer base surface and the rotational axis of the base. The openings in the group have an axis that is substantially parallel to a line that bisects the arc for the group. The one or more openings in the rotatable base provide a uniform distribution of fluid from the interior of the rotatable base to the outside of the porous pad. The one or more openings in the rotatable base provide a uniform distribution with low pressure drop of fluid from the rotatable base to the outside of the porous pad. The openings in the surface of the rotatable base can provide a high void volume of openings per volume of rotatable base material. The rotatable base openings can provide a high void volume per volume of base material with a reduced or minimized pressure drop. In some embodiments the porous pad interlocks with the one or more openings in the base. The base can provide flow equalization and distribution of a liquid through a cored porous foam material such as a polyvinyl acetal comprising material interlocked with the base. In some embodiments, the porous foam material is mechanically interlocked with the base. Advantageously substrates to be treated with the porous pad on the base are presented with the essentially the same chemical presented to the face of the substrate regardless of position along the length of the porous pad or brush or the rotational position of the porous pad or brush.

Another embodiment of the invention is a molded rotatable base for a porous pad that provides flow equalization and distribution of a liquid to a substrate to be treated. In some embodiments the molded rotatable base includes a molded porous pad that interlocks with the openings in the base and optionally has a porous core. In some embodiments, the molded base is formed from a two piece mold and can include openings that include draft angles. The draft angles provide an essentially uniform fluid or liquid flow through the porous pad over the area of the base and facilitates removal of the mold plates from the molded base. In some embodiments the mold that is used to form the rotatable base can comprise two or more pieces. In other embodiments the mold that is used to form the rotatable base consists of two halves to form the openings in rotatable base. The molded base can include openings that span across or through the outer surface of the base to the inner surface of the base, the openings may include draft angles to facilitate removal of the molded base from the mold. A molded rotatable base can be manufactured less expensively than a machined components of a rotatable base. Molding permits manufacturing costs of a rotatable base to be lowered without sacrificing other attributes of the base such as strength, pressure drop, flow equalization or essentially uniform flow distribution across the rotatable base.

One embodiment of the invention is a porous pad cast onto a molded rotatable base with one or more openings in the base that include draft angles, the openings provide the rotatable base with the high void volume per unit volume of the base. Optionally the material of the base, its dimensions such as length, wall thickness, inner diameter, outer diameter, the void volume, or number of openings in the rotatable base can be chosen to provide a rotatable base with sufficient mechanical properties for a cleaning or coating process and provide essentially uniform flow through the pad with a reduced or minimized pressure drop.

In part, other aspects, features, benefits and advantages of the embodiments of the present invention will be apparent with regard to the following description, appended claims and accompanying drawings where:

Figure 1:
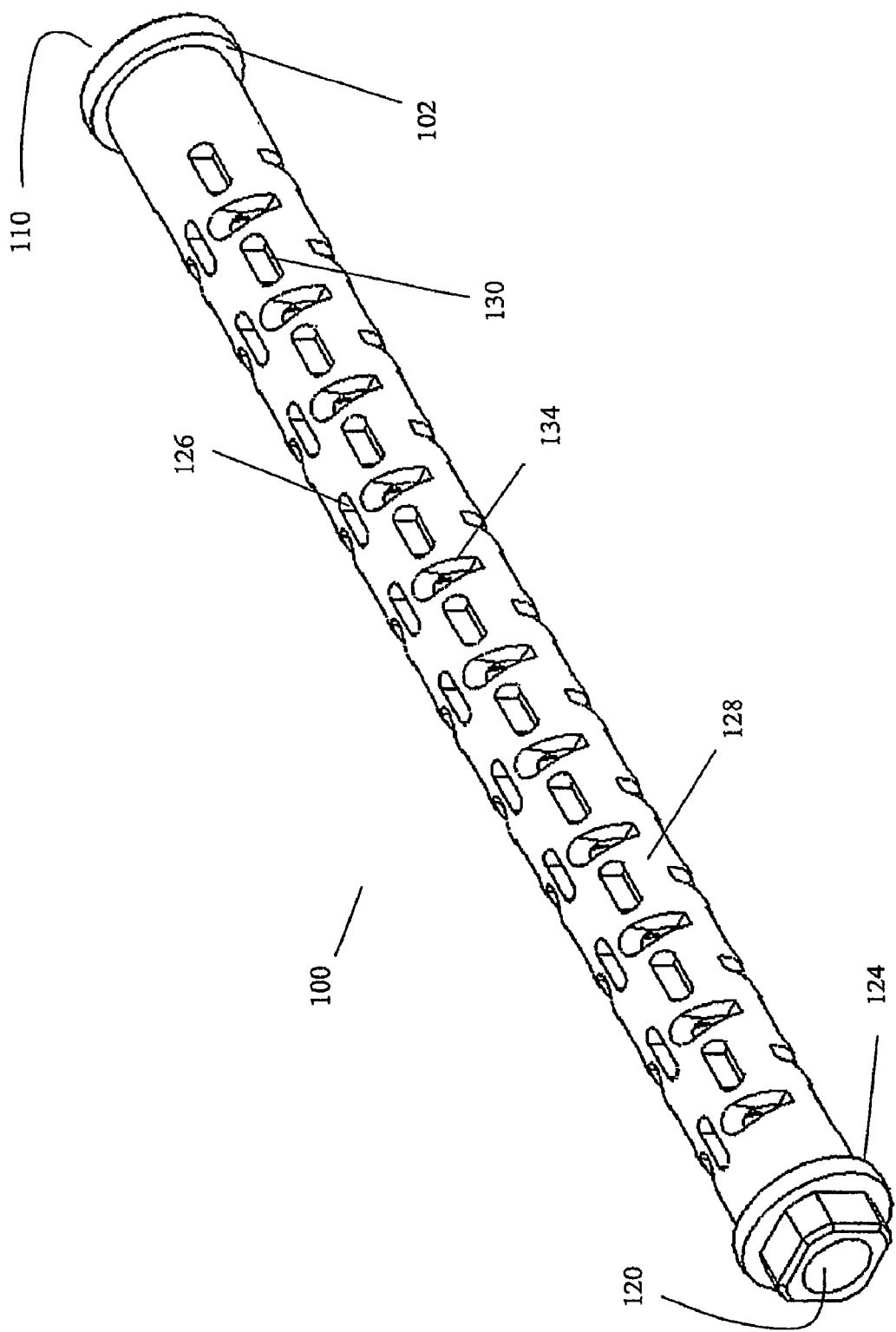
FIG. 1 is a perspective view of a rotatable base in an embodiment of the invention.

Before the present compositions and methods are described, it is to be understood that this invention is not limited to the particular molecules, compositions, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to an "opening" is a reference to one or more openings and equivalents thereof known to those skilled in the art, and so forth. Unless defined otherwise, all technical and scientific terms used herein have the same meanings as commonly understood by one of ordinary skill in the art. Various methods and materials similar or equivalent to those described herein can be used in the practice or testing of embodiments of the present invention. All publications mentioned herein are incorporated by reference. Nothing herein is to be construed as an admission that the invention is not entitled to antedate such disclosure by virtue of prior invention.

"Optional" or "optionally" means that the subsequently described event or circumstance may or may not occur, and that the description includes instances where the event occurs and instances where it does not.

Embodiments of the invention can comprise or include an elongated rotatable base that has an inner surface and an outer surface and where the rotatable base can be divided into one or more portions of a cylinder which can be the same or different. For example, the rotatable base may be described by a first half cylinder and a second half cylinder which can be separated by a plane such as would be formed by a two piece mold; the first and second half can have the same or different arrangement of openings or other feature such as flanges, mountings for drive end or fluid inlet, drive end or fluid inlet fittings. The inner surface of the rotatable base forms a bore in the rotatable base, the bore is surrounded by the inner surface and includes one or more openings between the inner and outer surfaces. The openings fluidly connect the inner and outer base surfaces. In some embodiments the openings can be described by an axis that is approximately or substantially parallel to a radial separation axis of a mold plate that was used to form the openings, the radial separation axis of the mold plate essentially bisects the mold plate. In other embodiments, each opening has an axis that is approximately or substantially parallel to the z-axis of the plane that divides the rotatable base into two half cylindrical shells or portions, the plane can be that which separates a two piece or two plate mold. In some embodiments, one or more openings in the rotatable base are at least partially filled with a foam or sponge material cast into the openings; in some embodiments that foam or sponge material is also cast onto the outer surface of the rotatable base. In still other embodiments, the form or sponge material interlocks with the rotatable base to form a core of the sponge or foam material within the bore of the rotatable base.

One embodiment of the invention is an apparatus that includes or comprises a rotatable base of thermoplastic material that has a closed cell structure. The rotatable base has a drive end, a fluid inlet end, an inner surface and an outer surface. the inner and outer surfaces of the base are interconnected by one or more openings that distribute a liquid from the inner surface of the base to the outer surface of the base. The openings and base can be formed in the thermoplastic material by two or more mold plates. The mold plates have one or more mold pins to form the openings in the base and the mold pins have an axis substantially parallel to a separation axis of each mold plate.

One embodiment of the invention is a rotatable base for a porous pad or brush. The rotatable base has a high ratio of open surface area per area of base that supports the porous pad. The porous pad can interlock with the openings of the base; in some embodiments the porous pad interlocks with the openings or channels and the porous pad can also form a passage or core within the base. The high ratio of surface opening area per area of base advantageously allows a uniform distribution of fluid to a substrate along the base. The high ratio of surface opening area per area of base advantageously allows a reduced or unrestricted distribution of fluid or liquid to a substrate along the base and pad.

FIG. 1 is a perspective view of a rotatable base 100 in an embodiment of the invention. The rotatable base can include a drive end 120, a fluid inlet end 110, an inner surface (not shown) and an outer surface 128. The inner surface and outer surface 128 of the base 100 are fluidly interconnected by one or more channels or openings such as 126, 130, or 134 that distribute a liquid from the inner surface of the base 100 to the outer surface 128 of the base 100. The rotatable base may further include drive end flange 124 and inlet flange 102 that support and position the porous pad (not shown) on the base 100 as well as a drive end 120 to connect the rotatable base to a drive portion of a process tool that can rotate the rotatable base 100. The liquid inlet 110 can be connected to a source of liquid from the process tool. In some embodiments of the invention the drive end of the rotatable base may be molded as an open conduit on both ends, for example the base is molded without a drive end 120, without a flange 124, or without an inlet flange 102. Separate drive end fitting and or inlet fitting, not shown, may subsequently be bonded by thermal, fusion, vapor, adhesive, or other techniques to the ends of the rotatable base to provide a drive end 120 with flange 124 and inlet flange 102. This approach to making a rotatable base can be used to configure rotatable bases for a variety of process tools having different drive ends or inlets while using a basic mold to make the portion of the base without fittings, flanges, or offsets.

Figure 2:
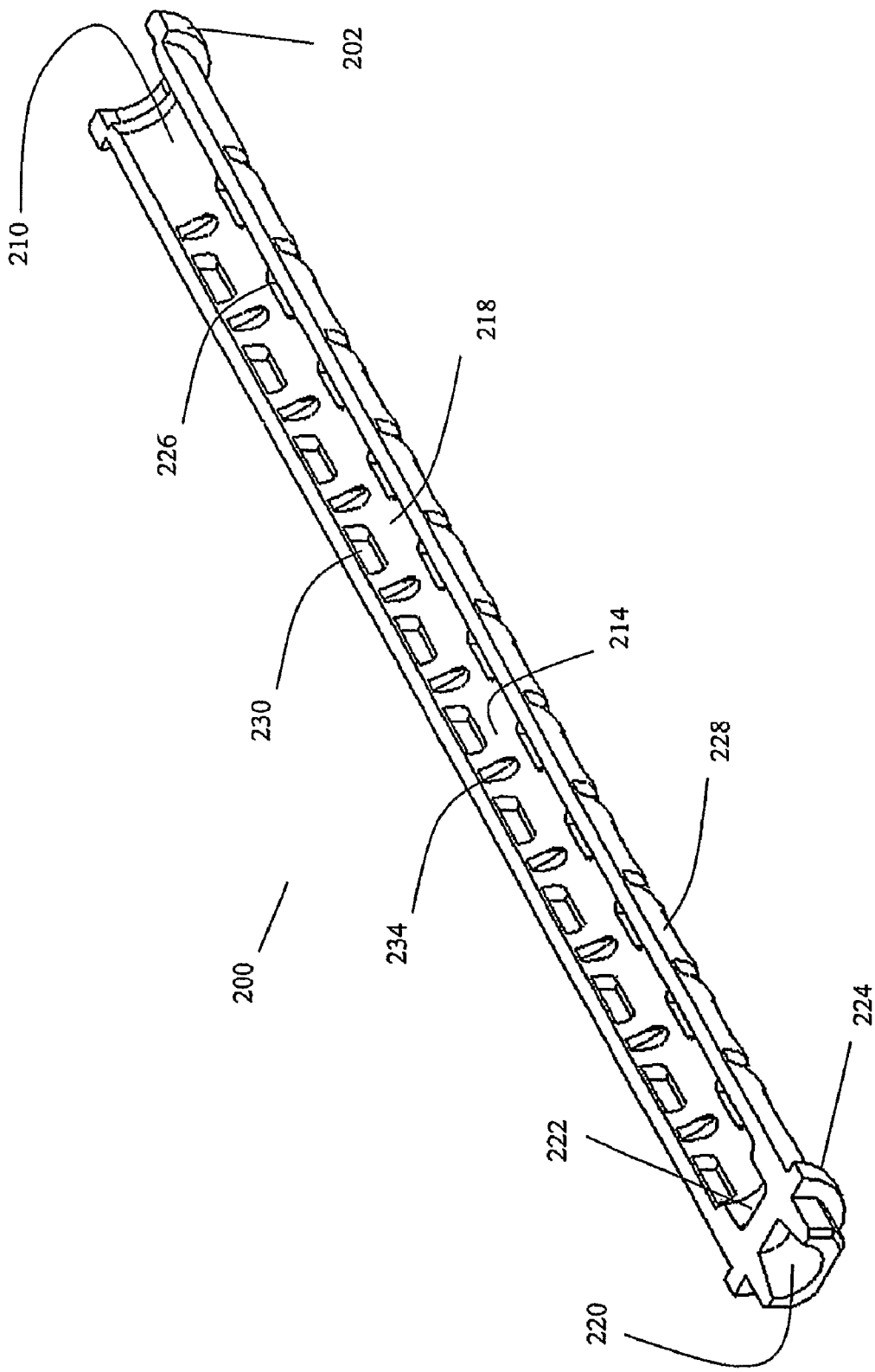
FIG. 2 is a perspective cross section along the length of a rotatable base in an embodiment of the invention.

FIG. 2 is a perspective cross section along the length of a rotatable base in an embodiment of the invention illustrating one half shell portion 200 of the rotatable base of FIG. 1 along a plane that includes the axis of rotation of the rotatable base. The plane (not shown for clarity) is positioned between two halves of a two plate mold that may be used to make the rotatable base or rotatable brush core. As illustrated, the half shell portion 200 of the rotatable base includes openings such as but not limited to opening 226 (without draft angle), opening 230 (includes draft angles), or 234 (includes draft angles) that are disposed about the first cylindrical half shell portion 200 and fluidly interconnect the outer base surface 228 with the inner base surface 214. Other combinations of openings as well as different shapes may be used. As illustrated in FIG. 2, the inner surface 214 describes a half portion of a bore 218 of the rotatable base that allows liquid flow from the inlet end 210 with optional flange 202 to the distal end which in this illustration optionally includes a core pin locator 222, flange 224 and drive end 220. Two half shell portions such as 200 form a rotatable base. In some embodiments of the invention half shell portions such as 200 can be separately molded and joined together by fusion bonding, melt bonding, or by other suitable techniques to form a whole rotatable base 100 as shown in FIG. 1. The inner surface 214 of the base can be used to seal to an o-ring, gasket, or other sealing surface from a process tool and deliver fluid or liquid via the inlet 210 to the core of a porous pad (not shown) or in some embodiments to the inner surface 214 of a rotatable base. The optional core pin locator 222 can be used to provide a core in the porous material in some embodiments. The base can include a drive end 220 with an optional flange 224, the drive end connects the base with the tool spindle. The base can include a fluid end 210 which can also include an optional flange 202.

Figure 3:
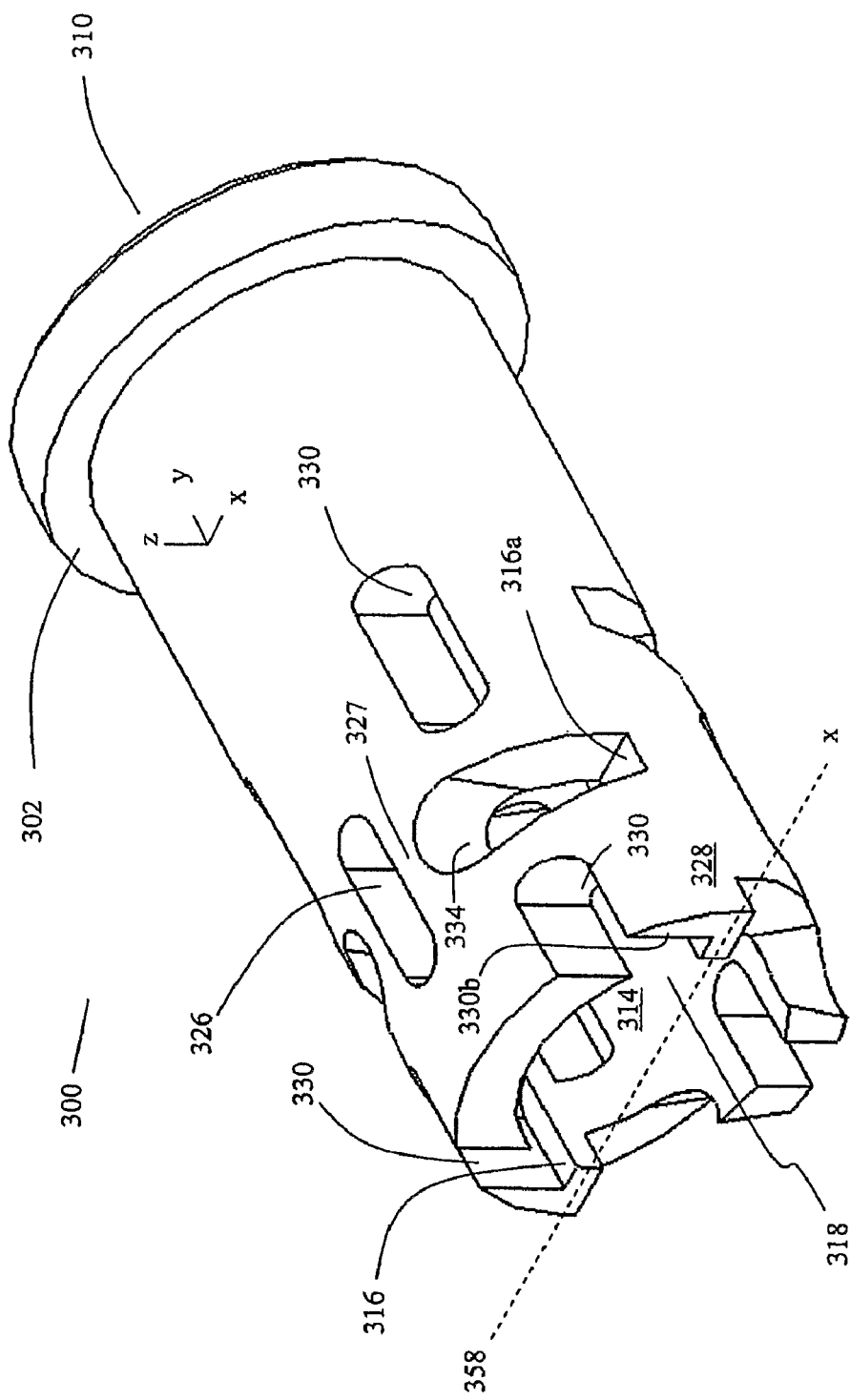
FIG. 3 is a perspective of a cross section of a base in an embodiment of the invention illustrating the x-z plane and a rotational axis of the base that lies along the y-axis.

FIG. 3 is a perspective of a cross section perpendicular to the length of a rotatable base 300 in an embodiment of the invention with a fluid end flange 302 and fluid inlet 310. The base has an inner surface 314 and an outer base surface 328 that forms a bore 318 of the rotatable base 300. The drawing illustrates stop edges such as 316 and 316a that can be formed from mold pins or by machining. In some embodiments a thermoplastic comprising a blowing agent can be machined to form a rotatable base. Various openings with draft angles such as 330 and 334, and one or more openings without draft angles such 326 are illustrated. Embodiments of the invention include openings having at least one draft angle. These openings can be made using a two piece mold or a two plate mold or by machining. FIG. 3 illustrates an xyz coordinate system with a plane that includes 358 essentially dividing the rotatable base into a first half and second half. The plane can be positioned in the x-y plane as shown, the axis of rotation of the rotatable base lies along the y-axis and is in the x-y plane. The x-z plane contains the plane that the rotation axis projects through, the x-z plane is perpendicular to the x-y plane.

Figure 4:
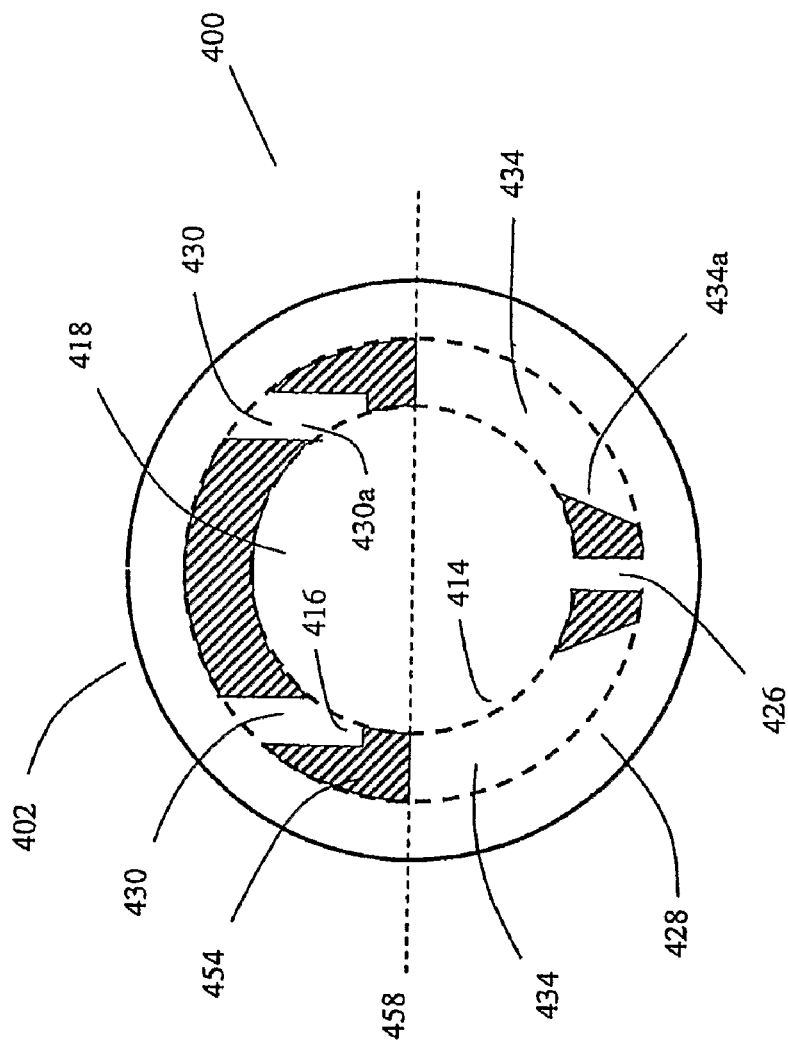
FIG. 4 is a cross section view of an embodiment of a rotatable base.

FIG. 4 is a cross section view of an embodiment of a rotatable base 400 taken in an x-z plane of FIG. 3 as viewed from the core pin locator end toward the fluid inlet end. The rotatable base 400 is illustrated having a base wall 454 and a fluid end flange 402, an outer base surface 428 and an inner base surface 414 that forms a bore 418. The inner base surface 414 encloses the bore and has inner surface openings such as 430a that connect to opening 430 with draft angles relative to the outer surface 428 of the base 400. Opening 430 illustrates a mold stop edge 416. Other openings between the inner surface 414 and the outer surface 428 include but are not limited to those such as 426 without draft angles, those such as 434 having draft angles and tapered wall 434a. The plane 458 is shown dividing the cross section of the rotatable base.

Figure 5:
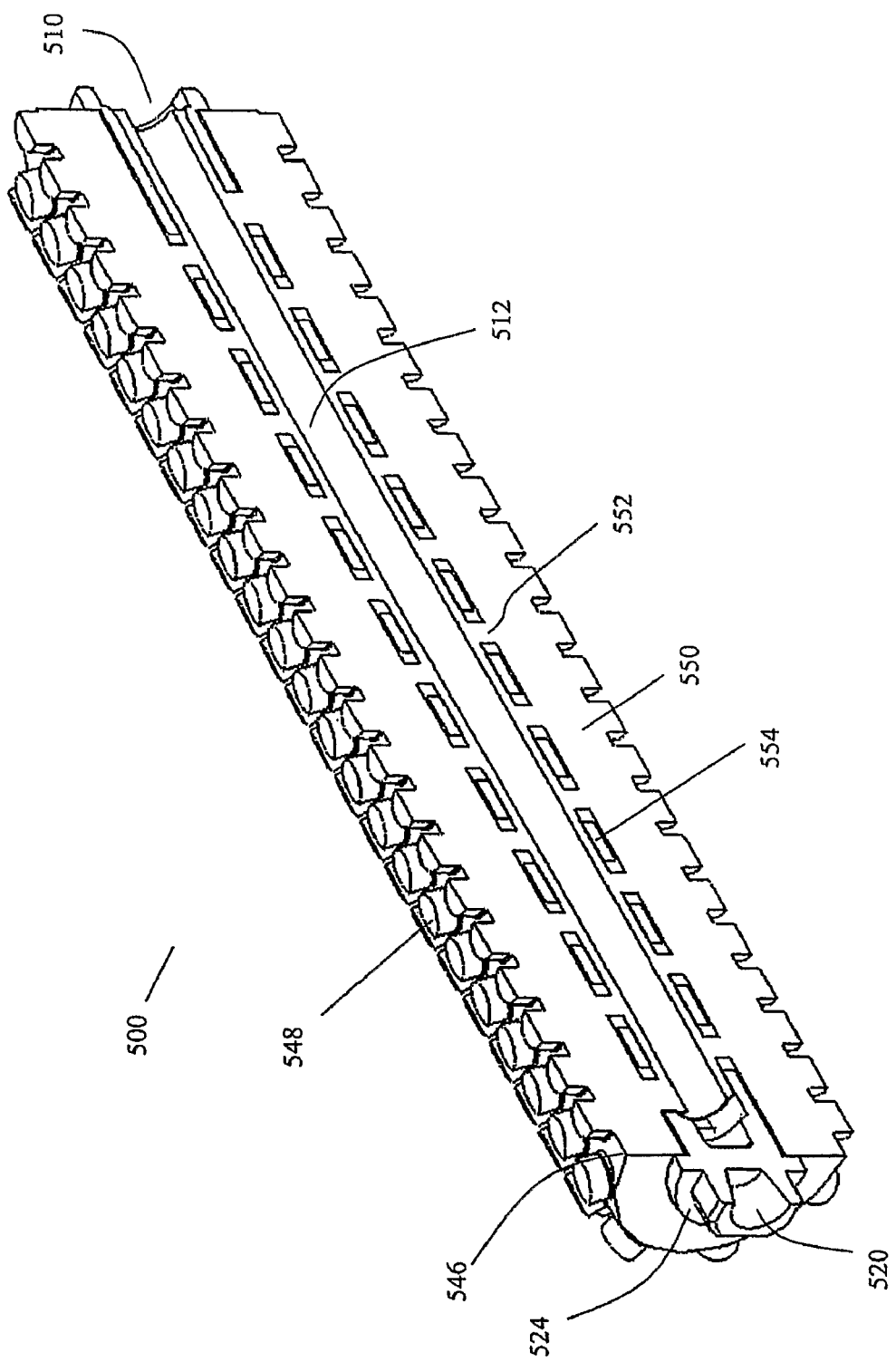
FIG. 5 is a perspective cross section along the length of an embodiment of the invention illustrating a porous pad that interlocks with a rotatable base.

FIG. 5 is a perspective cross section along the length of an embodiment of a rotatable base with a porous pad 500 illustrating a non-limiting example of the porous pad 550 interlocking with a rotatable base 554. The porous pad can include outer surfaces 546 and protrusions or nodules 548. The rotatable base 554 can have a high void volume with a high portion of the outer base surface area occupied by openings. The porous pad in a base opening 552 is illustrated along with a core 512 of porous pad or foam material in the bore of the base 554. The base can be molded from a two plate mold that forms one or more openings that have draft angles; optionally the molded rotatable base can include a drive end 520 and flange 524 as well as a fluid inlet 510. The rotatable base provides an improved distribution of fluid from the fluid inlet 510 through the core 518 and into the foam or porous material 550 via openings in the rotatable base 554. The liquid can be distributed to the outer pad surface 546 and protrusions 548 where it is distributed onto a substrate or other surface to be treated.

Figure 6:
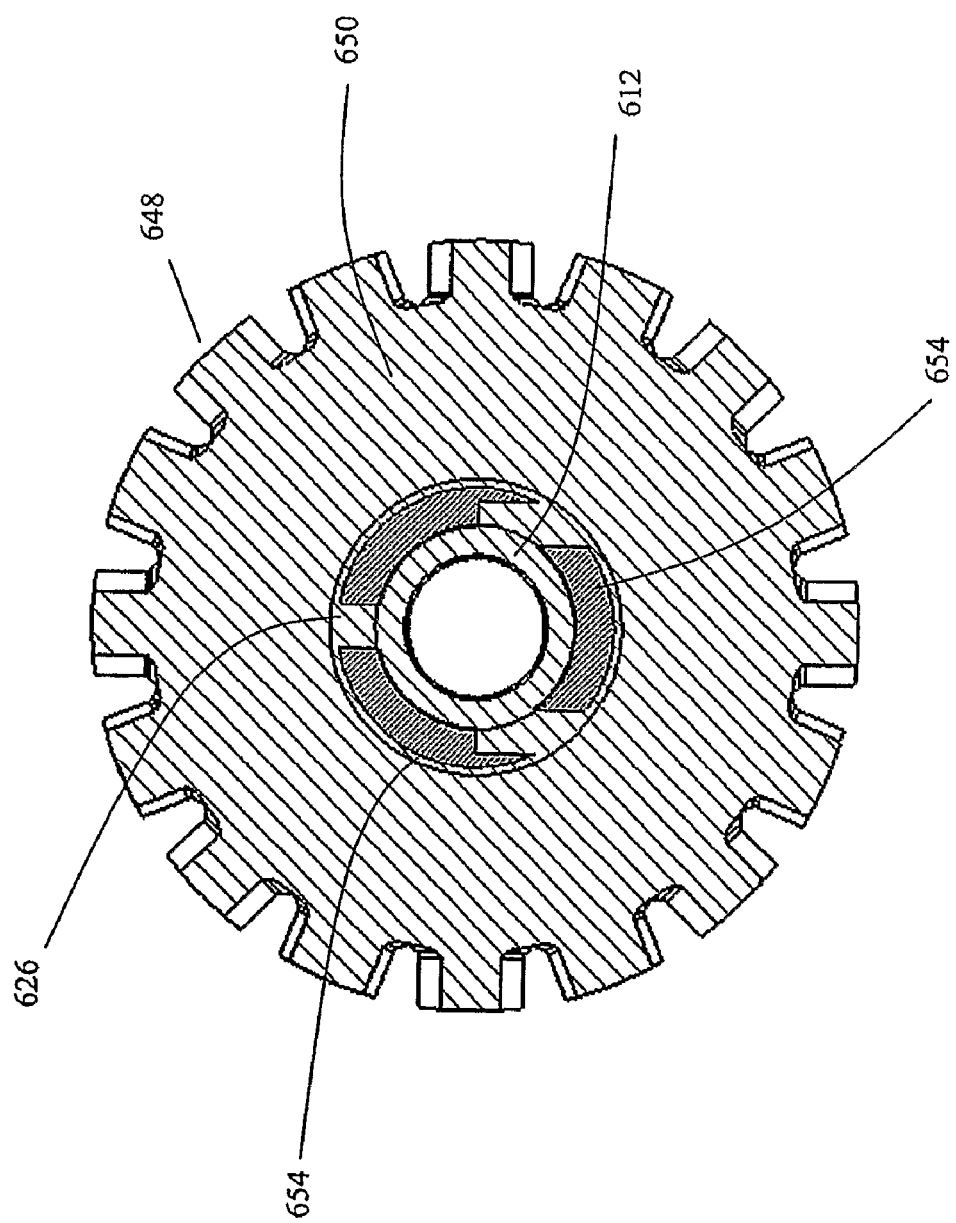
FIG. 6 is a cross section taken perpendicular to the length of a rotatable base at a point along the length of the rotatable base that illustrates a porous pad cast into openings of a rotatable base; the rotatable base may be made from a two plate mold.

FIG. 6 is a cross section of the rotatable base in FIG. 1 at a first point along the length illustrating a porous pad 650 with optional protrusions 648 cast onto an embodiment of a rotatable base 654. The illustration shows that the porous pad molded to the base 654 forms a core 612 of the porous pad or foam material. The porous pad is shown in one or more through channels or openings like 626 in the base 654; the base can be molded from a two plate mold.

Figure 7A:
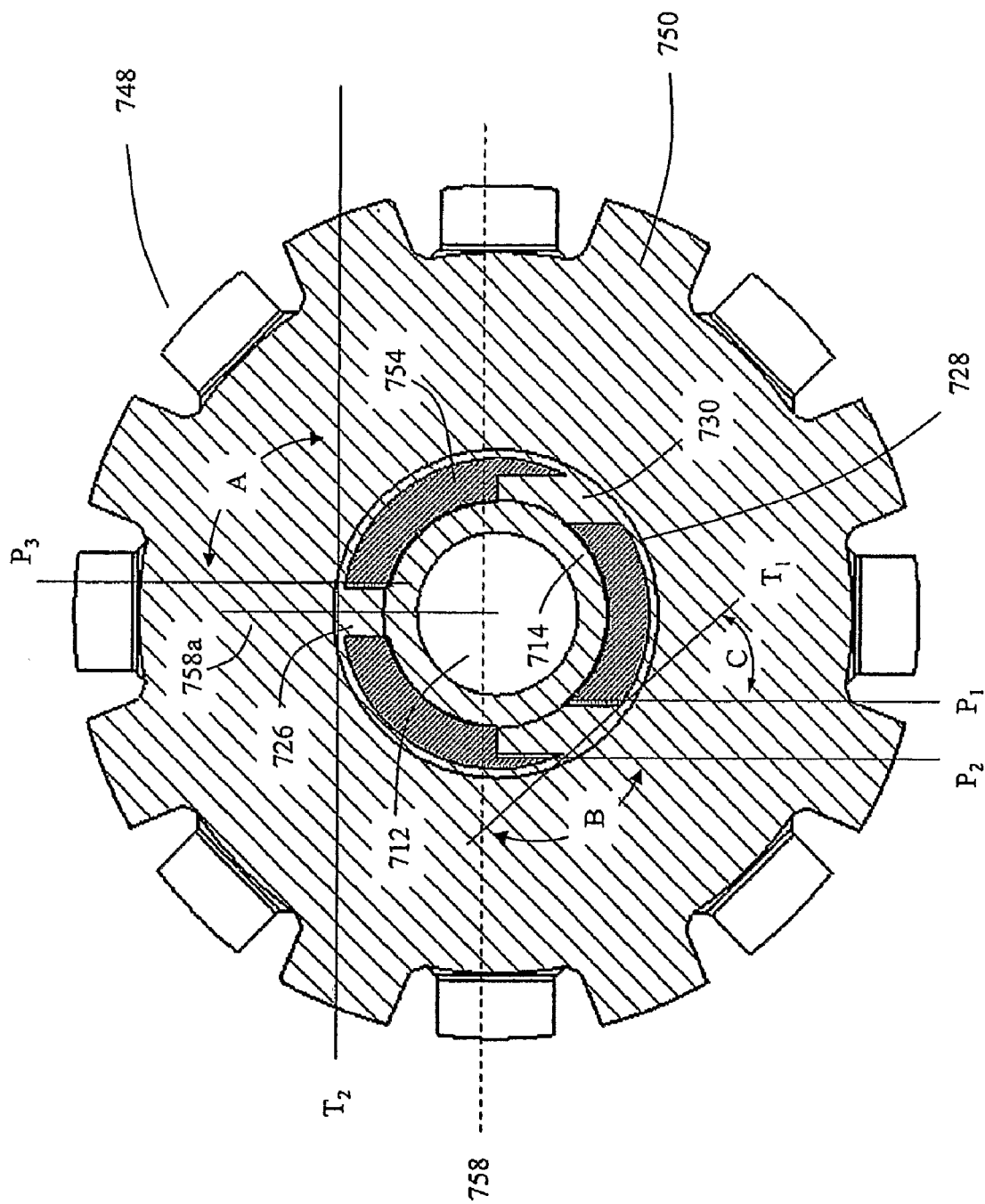
FIG. 7A-B illustrate a cross section taken perpendicular to the length of a rotatable base in an embodiment of the invention (a porous pad cast onto a rotatable base); these figures further illustrates aspects of a base made from a two plate mold.
Figure 7B:
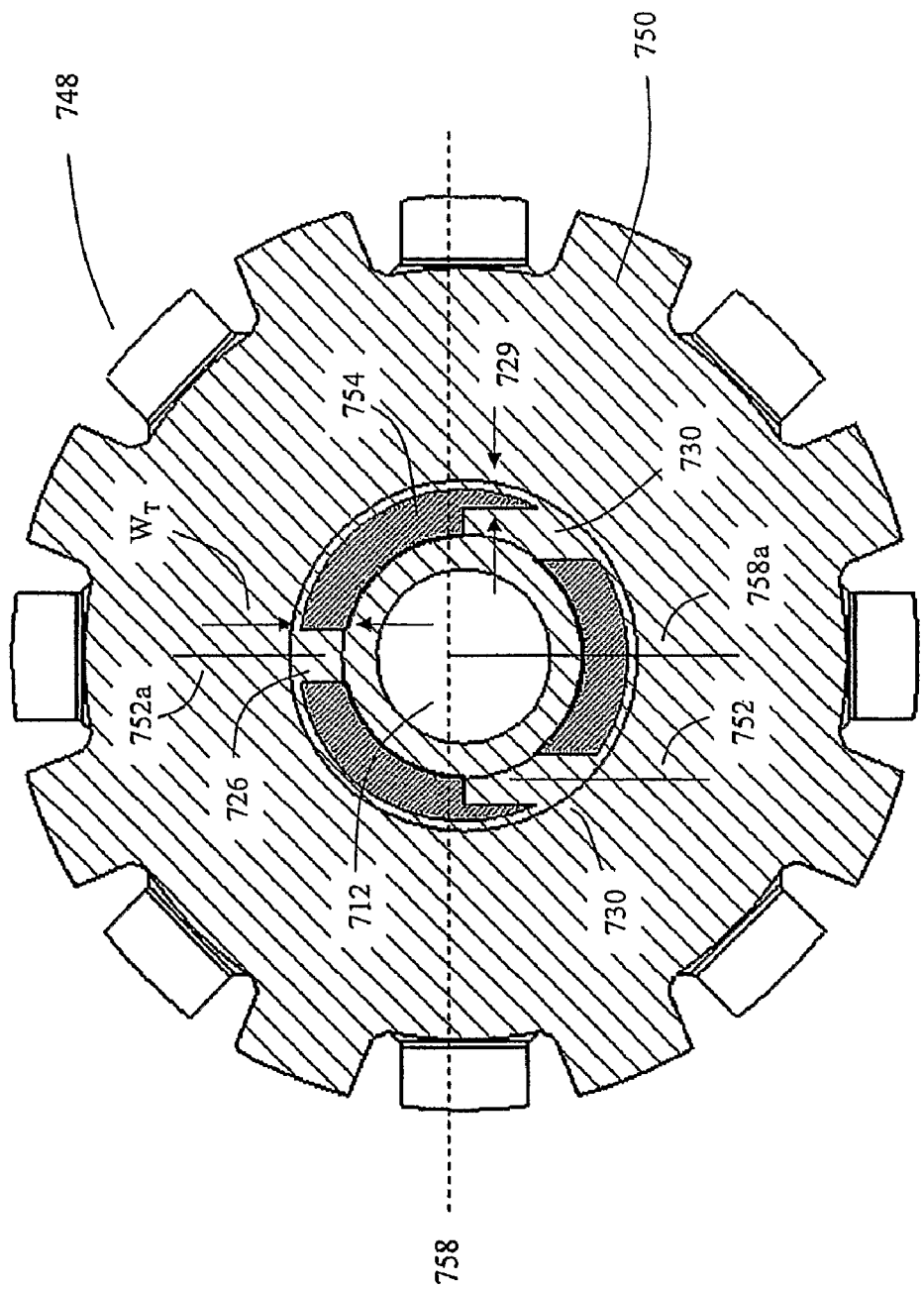

FIG. 7A-B illustrate a cross section of the rotatable base in FIG. 1 taken at a second point along the length of the base. The cross section illustrates a foam or porous pad material 750 with one or more protrusions 748 filling one or more openings such as but not limited to 726 and 730 that interconnect the outer base surface 728 and inner base surface 714 through rotatable base wall 754 of thickness $W_T$. Optionally the porous pad material 750 forms a core 712 along the inner base surface 714. Openings, such as 726 and 730 with for example various draft angles (A, B, C) that can be formed in the base are shown relative to lines $T_1$ and $T_2$ tangent to the outer surface of the base and lines $P_1$, $P_2$, and $P_3$ parallel to a wall of the openings. More specifically, the non-limiting draft angle B can be described relative to lines $T_1$ and $P_2$. FIG. 7B illustrates an imaginary plane 758 that divides the rotatable base into two half portions, the openings 730 and 726 each have an axis such as 752 and 752a respectively that is substantially parallel to a z-axis 758a perpendicular to the plane 758. The openings 730 and 726 have a shape and wall slopes described about an axis that is substantially parallel to the radial separation axes, which lies along 758a, of two mold plates (not shown) that could be used to form the openings. The z-axis 758a would essentially bisects the mold plates.

Figure 8:
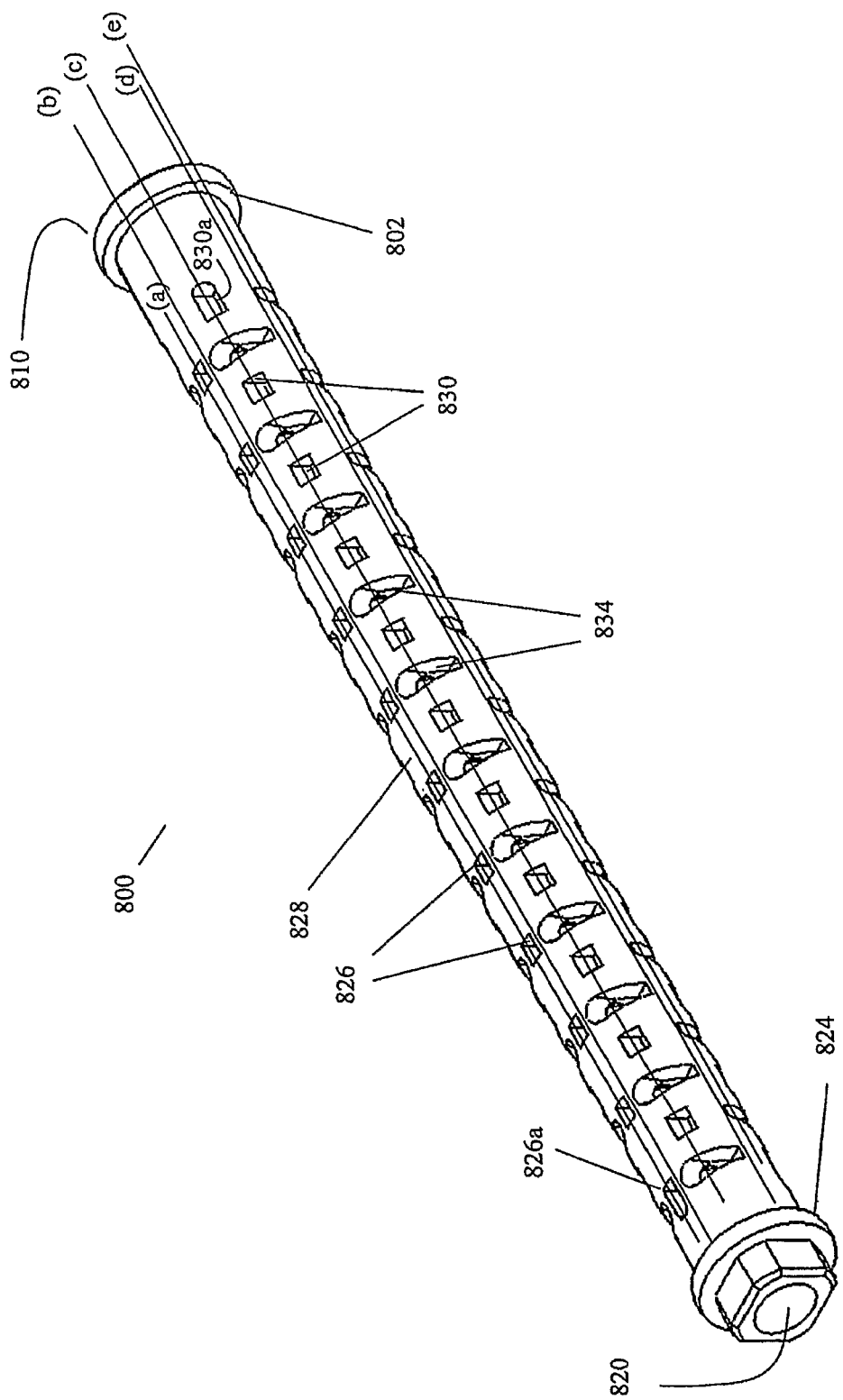
FIG. 8 illustrates an embodiment of the invention with one or more slots in the base having little of no wall angle, the slot can be in the shape of a rectangle other suitable shape.

FIG. 8 illustrates an embodiment 800 of the invention with one or more slots or openings of different shape in the base having little or no wall angle such as but not limited to 826 or 826a. The slot or opening can be in the shape of a rectangle other suitable shape such as made by a combination of joined straight and curvilinear lines. Also illustrated are one or more openings 830, 830a, or 834 in the outer surface 828 of the base 800 having a wall angle where the opening is in the shape of a rectangle other suitable shape such as a combination of joined straight and curvilinear lines. The embodiment of FIG. 8 illustrates a fluid inlet 810, inlet porous pad flange 802, drive end porous pad flange 824, and drive end 820. Lines (a)-(e) along the base 800 in FIG. 8 illustrate the close proximity of openings between adjacent rows of openings in the base as described herein.

Figure 9:
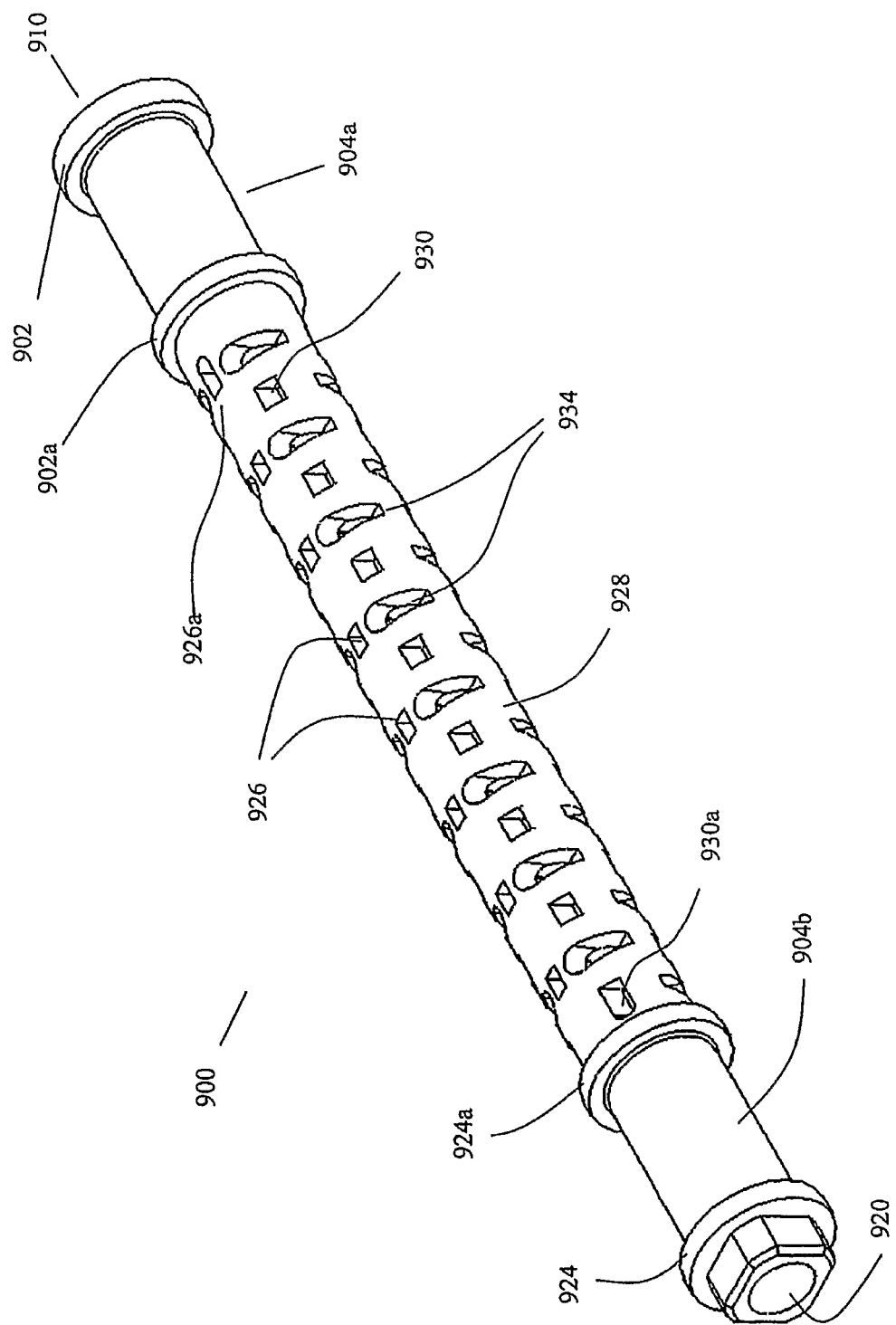
FIG. 9 illustrates an embodiment of the invention provided with one or more inner flanges that are offset from the drive end flange and base fluid inlet flanges.

FIG. 9 illustrates an embodiment of the invention 900 having a surface 928 that may be provided with one or more optional inner pad or sponge flanges 924a and 902a that are offset from the drive end flange 924 and base fluid inlet flange 902 respectively. The inner flanges 902a and 924a can be used to confine the porous pad material that interlocks with the one or more openings in the base 900 to select areas of the base between the inner flanges. The position of the inner flanges can be chosen based on the cleaning or coating requirements of the substrate to be treated, the size of the substrate, and the tool geometry. The offset regions 904a and 904b of the base may optionally be covered with porous pad material; the offset regions do not include openings to the bore of the rotatable base. The embodiment of FIG. 9 is illustrated with one or more slots or openings 926 or 926a in the base surface 928 that can have little of no wall angle that are in the shape of a rectangle 926 or other suitable curvilinear shape 926a; also illustrated are one or more openings in the base with a wall angle that is in the shape of a rectangle 930 or other suitable curvilinear shape 930a. Openings with a combination of wall angle and tapered sides 934 are also illustrated. The embodiment in FIG. 9 has a fluid inlet 910 and optional drive end 920.

Figure 10:
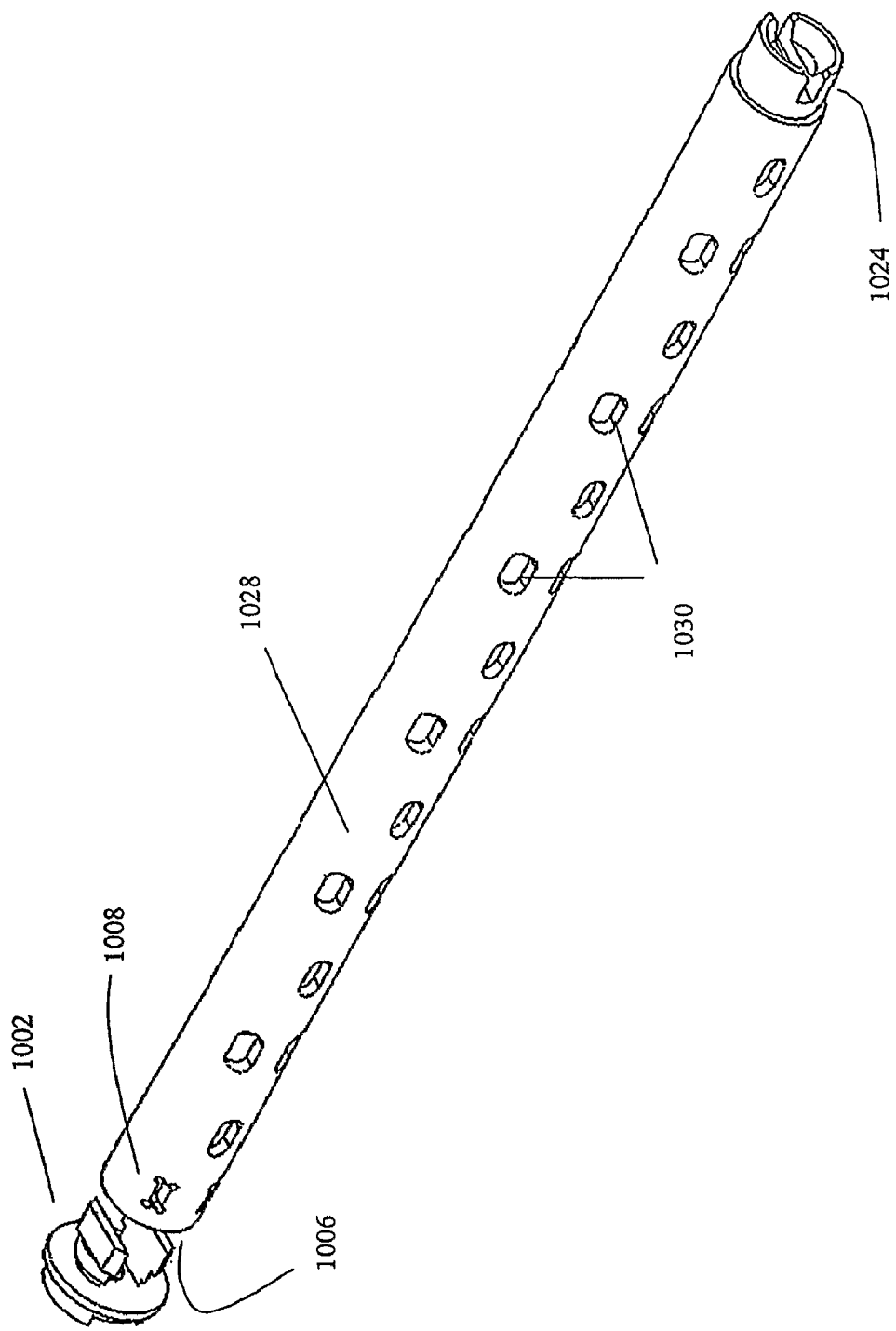
FIG. 10 illustrates an embodiment of the invention molded with an open fluid inlet end to which various fluid inlet fittings can be bonded.

FIG. 10 is an illustration of an embodiment of the invention having oval shaped openings 1030 fluidly connecting the outer surface 1028 and inner surface (not shown) of the base 1000. The openings 1030 of the rotatable base 1000 are illustrated as optionally being aligned; in other embodiments the openings can be the same or different and may not be aligned. The openings of FIG. 10 are approximately 9% of the total surface area of the rotatable base that would be located underneath a porous pad material or other foam material overlying the outer surface 1028 of the rotatable base (pad not shown). The size and shape defining the openings and distance between the openings 1030 connecting the bore (not shown) and outer surface 1028 along with the reduced thickness of the wall between the bore and outer surface of the base eliminates the need to form surface channels with holes or matrix channels with holes in the surface of the rotatable base to distribute liquid from the core to the base. FIG. 10 illustrates that embodiments of the invention can be molded absent a drive end and or an inlet fitting. In FIG. 10 the rotatable base is formed with a molded drive end fitting 1024 and a fluid inlet end 1006. A separate fluid inlet fitting 1002 may subsequently be bonded by thermal, fusion, vapor, adhesive, or snap fit into opening like 1008 at the fluid inlet end 1006 of the rotatable base to provide integral drive end 1024 and fluid inlet flange 1002. This approach can be used to configure rotatable bases for a variety of process tools having different drive ends and or fluid inlets while using a single mold to make the portion of the base without drive end fittings, flanges, or offsets.

Figure 11:
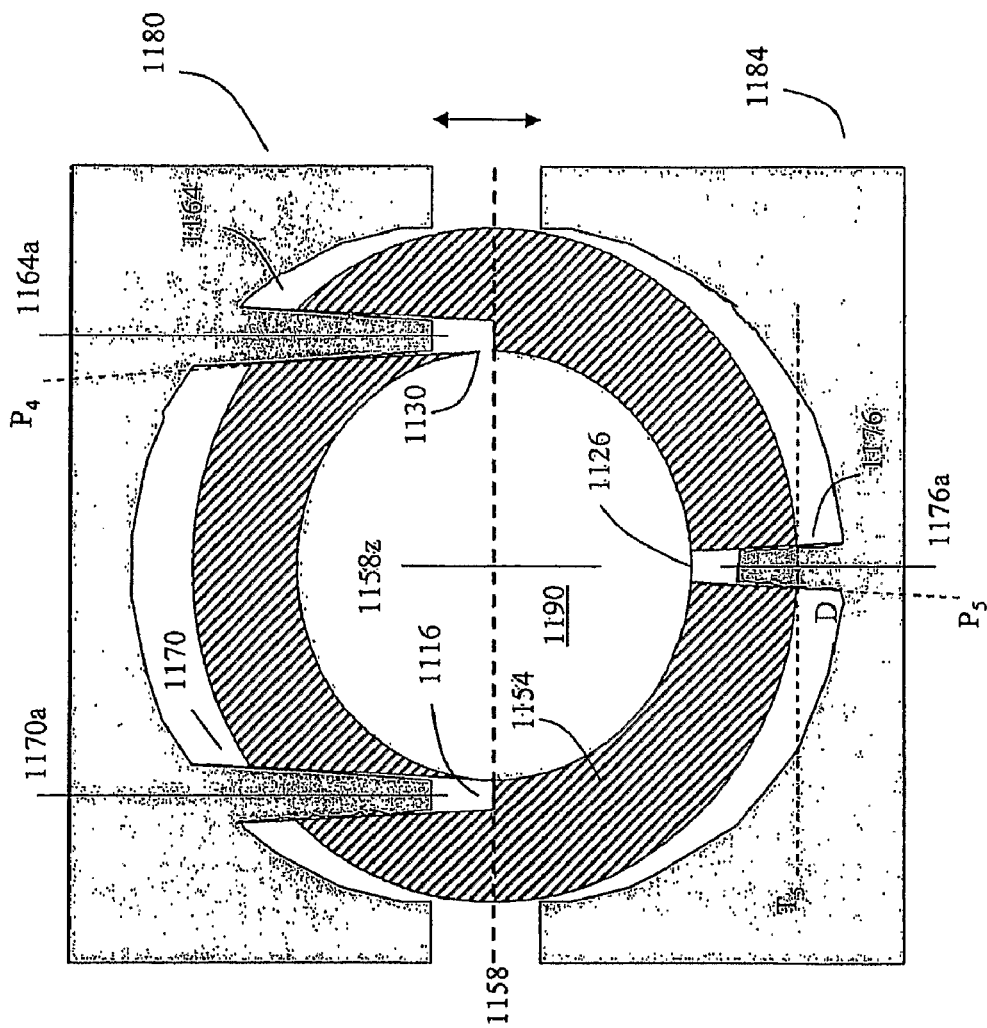
FIG. 11 illustrates in cross section the molding of a rotatable base with a two plate mold where the mold pins each include an axis that is substantially parallel to the z-axis of a plane that would be positioned between joined mold halves.

FIG. 11 illustrates the cross section of a rotatable base or rotatable brush core 1154 with mold pins 1164, 1170, and 1176, mold halves 1180 and 1184, and center mandrel 1190 that can be used to form openings or open areas such as but not limited to 1126 or 1130 in the rotatable brush core 1154. FIG. 11 is an illustration of a two piece or a two plate mold used in embodiments of the invention to make a rotatable brush core with openings or open areas for fluid flow between the bore and surface of the rotatable brush core. Some openings can have a mold stop as illustrated by 1116. The openings 1126 or 1130 can have one or more angled or tapered side walls illustrated by $P_4$ and $P_5$ (for example angle D between $P_5$ and $T_5$ is not equal to 90°) lines parallel to the side walls of openings formed by pins 1164 and 176 respectively. As illustrated, each mold pin, and hence each opening, has an axis such as 1164a, 1170a, or 1176a that is substantially parallel to a separation axis that bisects the two mold plates. In FIG. 11 the mold plate separation axes lie along the z-axis 1158z of the plane 1158; in the case of mold plate 1184 the separation axis lies along line 1176a. As illustrated, each mold pin, and hence each opening, has an axis such as 1164a, 1170a, or 1176a that is substantially parallel to the a radial separation axis for the mold plates 1180 and 1184. While FIG. 11 illustrates a two plate mold having mold pins with axes substantially parallel to the mold plate separation axis, embodiments of the invention can have two or more plates.

Embodiments of the invention can solve the problem of increasing liquid flow through porous pad on a rotatable base. For example under similar feed pressure conditions, prior rotatable bases with interlocked porous pad could deliver approximately 1.8 liter per minute water flow at 5 psi feed pressure, embodiments of the present invention can deliver about 3 liter per minute water with a 5 psi feed pressure. Further, embodiments of the invention address the problem related to the uniform filling of rotatable base openings with foam or porous pad forming materials during manufacture. Incomplete filling and or wetting of the rotatable base openings and surfaces with viscous porous pad reagent materials during casting of porous pad or foam precursor compositions with the rotatable base can lead to incomplete pad coverage on portions of the base and may requires scrapping of the rotatable base. By providing large openings in the wall of the rotatable base, these viscous pad forming materials can more readily flow between the inner and outer base surfaces of the rotatable base. Embodiments of the invention address the problem of providing high ratio of open surface area to a rotatable base while providing sufficient stiffness to the rotatable base so that cleaning or coating uniformity is maintained while reducing costs by using molding technology. One would expect that as the openings in the rotatable base were made larger that the dimensional stability of the base would be compromised. Embodiments of the invention provide a molded rotatable base with sufficient dimensional tolerance and stability for coating or cleaning of wafers. Some versions of the rotatable base are made from a thermoplastic formed with a blowing agent that further provides a high surface area of openings; the base can be made by using a two piece mold. Further, by using a blowing agent, a textured surface is formed on the rotatable base that increases surface area to interlock the porous pad or foam with the base. In some embodiments, the wall portions of the openings can have a wall thickness that is less than the wall thickness of the rotatable base. Such structures provide a high void volume of openings while the blowing agent helps to provide rigidity and strength to the base.

Embodiments of the rotatable base with a high void volume or surface area of openings can be molded such that the openings between the outer surface and the inner surface of the base can be positioned to have a separation between adjacent opening and or portions of the opening where the wall thickness of a portion of the opening is less than the thickness of the wall of the rotatable base. For example as illustrated in FIG. 3, the wall thickness for opening 330 between surface 330b and outer surface 328 is less than the thickness of the rotatable base wall $W_T$ between inner surface 314 and outer surface 328. As shown in FIG. 3, openings in the surface of the rotatable base can have portions of walls that are thinner and or taper to regions having a thickness less than the wall thickness of the rotatable base; such openings can provide a high void volume of openings in the base. FIG. 3 also illustrates that the base wall region between openings such as 326 and 334 identified by the reference line 327 can be thinner that the thickness of the wall $W_T$, in some embodiments the region can be less than 50% and in some versions 40% or less of the wall thickness. In a non-limiting example, the thickness of this region in one embodiment is about 0.2 cm while the rotatable wall thickness is about 0.5 cm. It is unexpected that a molded rotatable base could be formed with void volume or surface area openings as detailed in embodiments of the present invention with sufficient dimensional tolerance and stability for coating or cleaning of wafers. It is unexpected that a molded rotatable base having increased surface bonding area from a blowing agent could be formed into a rotatable base with a void volume or surface area openings of between about 6% and 40% that had sufficient dimensional tolerance and stability for coating or cleaning wafers.

Another attribute of the openings in embodiments of the invention are shown by the non-limiting illustration of FIG. 8. In FIG. 8 the openings in the surface of the brush core or rotatable base into the bore of the rotatable base provides openings along the length of the rotatable base where the openings from one row are separated from the opening on an adjacent row by a row or strip of closed surface 828 that can be less than the width of the smallest opening on the surface of the rotatable base. For example, the openings of row (a) are separated from openings in row (c) by narrow strip of closed surface that lies along the line (b) that has a width less than the width of smallest feature 826. Similarly, the opening of row (c) are separated from the holes in row (e) by a narrow strip of closed surface (d) having a width less than the width of smallest feature 826. The close proximity of openings along the rotatable base facilitate casting viscous porous pad or foam reagents onto the base during manufacturing and also facilitates the distribution and flow of liquid from the inner bore of the base to the outer surfaces of the porous pad.

Sufficient dimensional tolerance, twisting stability, linearity or other aspects of a rotatable base or brush core in embodiments of the invention refers to a rotatable base or rotatable brush core that can be combined with a porous pad or foam material and the resulting article can be used to clean test wafers and provide a particle removal efficiency of greater than 85% and in some cases greater than 98% across a wafer surface after a period of time which can range from about 10 seconds to about 10 minutes. Changes in the surface area of openings on the base, the wall thickness, amount of blowing agent, the dimensions of the rotatable base, foam or sponge material, or other features of the rotatable base could be made and referenced to this specification.

The thickness of the rotatable base wall can vary and may depend upon material used to make the base as well, liquid flow rate, and overall length of the rotatable base. In some embodiments, the wall thickness, $W_T$, of the base can be from about 0.1 inches to about 0.5 inches thick. In some embodiments it is from about 0.13 to about 0.26 inches thick. Based upon the material used to form the base, the thickness of the wall and the area of openings can be chosen to provide sufficient strength and stiffness for the rotatable base. The rotatable base can be made with a predetermined number of openings so that the combination of porous pad and base can be used to provide fluid flow under set feed pressure to a substrate that is sufficient for its intended use and application uniformity (cleaning uniformity across a substrate, etching uniformity across a substrate, coating uniformity across a substrate). These requirements may vary for different substrates and processes, the material for the base can be chosen accordingly. The base may be made from any chemically inert polymeric material, including polymer, copolymers, and other materials useful in CMP cleaning processes and the like.

Chemically inert polymeric material useful in CMP cleaning processes, can be used for the rotatable base or brush core. This can include various thermoplastic polymeric materials. In some embodiments, the thermoplastic can be a polyolefin. Polyolefin refers to any polymerized olefin, which can be linear, branched, cyclic, aliphatic, aromatic, substituted, or unsubstituted. In some embodiments polyolefins can be, but are not limited to, polyethylene (PE), such as high-density polyethylene (HDPE), medium-density polyethylene; low-density polyethylene (LDPE); polycarbonate (PC); polypropylene (PP); polypropylene copolymer (PPCO); polyallomer (Ethylene-Propylene Copolymer or PA); polymethylpentene (PMP); polyketone (PK); polyethylene terephthalates (PET) including oriented PET. In some embodiments the polyolefin is polypropylene or mixtures that include polypropylene. Composites of thermoplastic materials containing fillers such as ceramic particles or carbon fibers can also be used in embodiments of the rotatable base of the invention.

In some embodiments polymers used for the rotatable base may include those injection moldable thermoplastics that incorporate a blowing agent to form closed cell structure in the thermoplastic polymer. In some embodiments the thermoplastic including the blowing agent may be a polyolefin, in other embodiments the polyolefin including the blowing agent is polypropylene or mixtures that include polypropylene.

Blowing agents for use in the present invention are not limited to any particular type. The blowing agent will not deteriorate the resin or produce an adverse effect, for example increase particle shedding or an increase in ionic extractables, on the resin. Examples of useful blowing agents can include but are not limited to inorganic gases such as carbon dioxide, nitrogen, argon, neon helium and oxygen, and organic gases such as chlorofluorocarbons or mixtures of these. The blowing agents provide a closed cell structure to the polymer or resin used for making the rotatable base. Foamed polymeric materials can be produced by introducing a physical blowing agent into a molten polymeric stream, mixing the blowing agent with the polymer, and injection molding the mixture into a mold such as the mold illustrated in cross section in FIG. 11. Nucleating agents may be used to control cell size and uniformity in the thermoplastic.

In embodiments of the invention, the blowing agent can provide surface roughness or textured surface features to the surfaces of the rotatable base or brush core that can increase the surface area for bonding and interlocking the brush material with the rotatable base or brush core. These molded surface features can be irregular in shape and have a size on the order of the closed cell structures formed within the walls of the rotatable base. The size and shape of the surface features can be modified by controlling the conditions under which the blowing agent and or nucleating agents are utilized in molding the rotatable base.

In some embodiments, the blowing agent can be a solid mixed with the polymer, for example polypropylene. The blowing agent can be mixed in an amount of from about 0.25% to about 5% by weight, and in some embodiments from about 1% to about 2%, with the polymer and the mixture molded. The amount of blowing agent can be chosen to provide a base that has little or no bow over its length.

In some embodiments the amount of bow of the molded rotatable base can be determined by placing the base on a flat reference surface and measuring the deviation in distance between base surface and the reference surface along the length of the base. In some embodiments the deviation over 15 inches (38.1 cm) of a base is less than about 0.04 inches (0.1 cm), in some embodiments the deviation is less than about 0.01 inches (0.025 cm). In some embodiments where the base is formed using a blowing agent, the deviation over 15 inches (38.1 cm) of a base is less than about 0.04 inches (0.1 cm), in some embodiments the deviation is less than about 0.01 inches (0.025 cm).

Embodiments of the present invention provide a rotatable base for an interlocked porous pad or brush that has a high ratio of surface opening area per area of base and that is stable at temperatures used in an injection molding process or in post molding machining processes. In some embodiments the porous pad or brush is mechanically interlocked with the base through the openings, mechanically interlocked through the core, or mechanically interlocked to the rotatable base by any combination of these. Embodiments of the invention resist loss of dimensional tolerances, loss of linearity or dimensional stability of the base during or following molding of the base. Embodiments of the invention exhibit improved linearity as well as torsional or twisting stability during and following molding and or post molding finishing operations. Embodiments of the invention can be made less inexpensively than machined brush cores. Further, embodiments are lightweight, dimensionally stable rotatable base parts that support a porous pad interlocked with one or more voids in the base where the base exhibits linear, torsional or twisting stability during use in cleaning substrates such as semiconductor wafers or flat panel displays.

With reference to FIG. 2 the bore 218 shown in the cross section perspective of rotatable base or brush core 200 refers to a center hollow or channel having a length that generally extends between a first end 210 to a second end 222 (which may be opened or closed) of the rotatable base and is defined by the inner base surface 214. As partially illustrated in FIG. 2, first end 210 can be a fluid inlet, that opens into the bore that is defined by an inner surface 214 of the rotatable base which extends along an inner length of the bore 218 to the second end which can be a core pin locator. A core of the rotatable base in embodiments of the invention is a bore that has been partially or completely filled with brush or sponge material to form a core as illustrated by feature 512 in FIG. 5. An opening in the rotatable base or brush core refers to a feature such as openings 226, 230, or 234 that fluidly interconnects the inner surface 214 of the rotatable base with the outer surface 228 of the rotatable base 200. In some embodiments of the invention, openings in a rotatable base can have a dimension about the circumference of the rotatable base that be greater than about $1/50^{th}$, in some embodiments, greater than about $1/25^{th}$, and in some embodiments greater than about $1/12^{th}$ the circumference of the rotatable base. The larger openings provide lower pressure drop and increased distribution of liquid from the core to the outer surface of the brush. In some embodiments, the openings can have a tapered shape moving from the outer surface to the inner surface of the rotatable base. This feature is illustrated by the surface 434a for opening 434 in FIG. 4, and is also illustrated by opening 334 in FIG. 3. Various combinations of tapered 334 and straight walled openings 326 can be used in embodiments of the invention. The tapered openings like 334 or 434 may provide improved support for the foam or brush material compared to an unfilled walled waffle structure, slot matrix, or channels that run from one end of the brush core to the other end.

In embodiments of the invention, the openings in the rotatable base or brush core are filled with porous brush material or foam. The filled openings provide support to the overlying foam material and prevents sagging which maybe experienced in other brush cores where the foam rests over open channels, open waffles, or the like. The foam in the opening in embodiments of the present invention support the overlying foam. In embodiments where the rotatable base has a foam core, the foam in the opening and core can support the overlying brush. In embodiments where the rotatable base has openings which taper from the outer surface to the inner surface, the taper can further support the overlying brush.

The void volume of the rotatable base wall having a thickness $W_T$ can be varied depending upon the pressure drop and fluid distribution requirements for the rotatable base. In some embodiments the void volume openings of the rotatable base wall in fluid communication with the bore of the rotatable base can range from about 6% to about 40% of the base volume. In other embodiments the void volume openings of the rotatable base wall can range from about 8% to about 30%, and in still other embodiments from about 20% to about 35% of the volume of the base. The void volume refers to the volume of material removed from the rotatable base that underlies the brush or foam, the void volume of the rotatable base can be filled with foam or sponge material.

The openings in the surface of the rotatable base in fluid communication with the bore of the rotatable base can range can range from about 6% to about 40% of the total surface area of the base in contact with the pad. In other embodiments the surface area of the openings can range from about 8% to about 30%, and in still other embodiments from about 20% to about 35% of the total surface area of the base in contact with the pad. For example, in the embodiment that is illustrated in FIG. 9, the surface area of the openings account for about 25% of the closed outer surface 928 that would be in contact with the brush or sponge material. In the embodiment illustrated in FIG. 10, the surface area of the openings can be about 9% of the closed outer surface 1028. The greater the amount of open surface area, the lower the pressure drop and better the distribution of liquid from the core or bore of the base to the substrate surface through the overlying foam. By varying the opening surface area and properties of the foam, for example the porosity, the flow of liquid from the bore of the rotatable base to a substrate can be modified.

Some of the openings in the surface in contact with the porous pad or foam in embodiments of the present invention are radially positioned about a central rotation axis of the rotatable base. These openings have an axis that can lie along a radius that emanates from the rotational axis of the base. Where the base is molded, these openings can have an axis that lies along the radial separation axis of the mold plate used to make the rotatable base. Other openings in the surface in contact with the porous pad or foam in embodiments of the present invention are not radially positioned. For molded rotatable bases, these openings can have an axis that is substantially parallel to the radial separation axis of the mold plate. For example, openings like 926 and 926a in FIG. 9 are radially positioned, while openings such as 930 are not. In another example, an opening like 326 in FIG. 3 is radially positioned while an opening like 330 is not. Embodiments of the present invention can have any combination of such openings provided the rotatable base can be made from a mold having two plates, and in some embodiments more than two plates. Unlike other brush cores that have only radially positioned openings to the bore and which must be machined or molded from molds with side action, embodiments of the present invention can be made from molds that do not require side action.

The rotatable base can be formed by placing a mandrel in the center of a mold having two or more plates and injecting thermoplastic optionally containing a blowing agent into the mold. The mold can be removed and the rotatable base or brush core subsequently used in a second molding process where the brush or sponge material is cast and interlocked with the base. In some embodiments the rotatable base is placed in a mold as described in International patent application No. PCT/US2004/022350, incorporated herein by reference in its entirety, and foam or sponge is used to fill the openings in the rotatable, base. In some embodiments the rotatable base is placed in a mold and a foam brush cast on the outer surface of the rotatable base with foam filling a portion of the openings; in some embodiments the foam or sponge forms a core in the bore of the rotatable base and interlocks the foam with the rotatable base.

In brush cores with waffles, the walled structure isolates waffles with holes to the bore from waffles without holes and can restrict liquid flow. Further, because the waffles are empty, they may not evenly support an overlying highly compliant brush or foam. Brush cores with channels along their length that are empty may also not evenly support an overlying highly compliant foam which may become compressed during use further restricting liquid distribution along the length of the channel of the brush core. In these prior art devices, the foam or sponge does not occupy the holes or protrusions into the core, rather it rests on top of the holes or on top of waffles or outer brush core surface. In these prior art brush cores, it is possible that during rotation, no openings will be positioned over the substrate along the length of the brush core. Embodiments of the rotatable base of the present invention may be absent a waffle structure in the wall of the brush core, or rows of channels or matrix slots in the wall of the core. Embodiments of the present invention provide access to the liquid from the bore at every surface recess or opening and because of the large surface area openings, compressed sponge does not significantly impeded the flow of liquid from the core or bore to the sponge surface in contact with the substrate. Further, in embodiments of the present invention where the core is a foam material, the inner foam core can provide support in the openings for the overlying foam brush that contacts the substrate.

The core or base can be machined or molded. In one embodiment, the base is formed from a single two-piece mold. The porous pad can be any material that can be placed onto the rotatable base. In some embodiments, the porous pad is molded onto the base such that it interlocks with the base. In some embodiments, the porous pad is cast into one or more openings in the rotatable base, the porous pad interlocking with at least a portion of the one or more base openings. In some embodiments, the porous pad forms a core within the rotatable base.

The base can include or comprise a variety of openings such as but not limited to channels, slots, or other closed shapes including but not limited to ellipses, rectangles, polygons, rounded rectangle, ellipse, closed spline, arc and any closed shapes including combinations of these.

These openings can be positioned about the surface of the rotatable base and extend from an outer surface of the base to an inner surface of the base through the base wall. The shape of the openings, including the angles of the sidewall as well as the shape of the opening on the inner and outer surface of the base can be chosen to provide a uniform flow of liquid from the pad in the openings to a substrate to be treated. In molded or machined versions of the invention, the openings can have a shape and wall slopes described about an axis that is approximately or substantially parallel to the radial separation axis of mold plate(s) that could be used to form the openings. The radial separation axis of the mold plate essentially bisects the mold plate. In some molded embodiments, the openings can have a shape and walls whose slope can be chosen to allow molding of the rotatable base with one or more openings from a two piece or two plate mold. The angles for these sloped walls can be referred to as draft angles. Embodiments of the invention include a mold with two plates, in some embodiments two or more plates, the mold has pins for making a rotatable base with one or more openings with draft angles; the openings provide an essentially uniform flow, and in some cases an unrestricted flow, of liquid from the inside of the rotatable base to a porous pad on the outer surface of the rotatable base.

In some embodiments of the invention, the rotatable base includes a plurality openings that can form various draft angles with the rotatable base, these openings each have an axis that is approximately or substantially parallel to the z-axis of the plane that divides the rotatable base into two half cylindrical shells or portions. The plane includes the rotational axis of the rotatable base or brush core. A first plurality of openings in the rotatable base are oriented along one half cylindrical shell portion of the base while a second plurality of holes are oriented along the second half cylindrical shell portion of the base. The holes or openings in each half shell provide fluid flow communication between the inner surface or bore of the rotatable base and an outer surface of the rotatable base.

Void volume is opening area multiplied by length or thickness of the base. In some embodiments the void volume of the openings are chosen to maximize the area opening while minimizing the length or thickness of the base, which can optionally be filled with a porous pad material that the liquid flows across or through. In some embodiments the wall thickness ($W_T$) of the base can be chosen to minimize the amount of porous material occupied by the wall of the base. This can be used to maximize the open area of the rotatable base and minimize the pressure drop of fluid across the porous pad that is interlocked with the base.

One embodiment of the invention is a mold having one or more plates that can be used to form a rotatable base. The mold plates can comprise an inner surface with one or more mold pins. The mold pins have an axis that is substantially parallel to a separation axis that bisects the mold plates. The mold plates can be combined into a mold to make a rotatable base that has a drive end, a fluid end, an inner surface and an outer surface; the inner and outer surfaces of the base are interconnected by one or more openings formed by the mold pins. The openings distribute a liquid from the inner surface of the base to the outer surface of the base.

Embodiments of the invention can be made by molding, machining or a combination of these operations. Generally the openings between the inner and outer surfaces of the rotatable base can be divided into one or more groups of openings, each group of openings lie within an arc described by the outer base surface and the rotational axis of the base. The openings in the group have an axis that is substantially parallel to a line that bisects the arc for the group. The portions described by the arcs can have the same or different angle. Openings for a group in the surface of an arc of the base can have an axis that is substantially parallel to a line that bisects the arc for that portion of the rotatable base. For example, in the embodiment illustrated in FIG. 11, openings in the rotatable base can be divided into two groups, each describing a arc with respect to the rotational axis (intersection of 1158 and 1158z). The opening 1130 is in a group described by an arc between 0° and 180° about the base 1154. This group of openings has an axis that is substantially parallel to the line 1158z that bisects the arc between 0° and 180° along the base. The opening 1126 is in another group described by an arc between 180° and 360° about the base 1154. This group of openings have an axis that is substantially parallel to the line 1158z that bisects its arc between at 180° and 360° along the circle. In another non-limiting example, a rotatable base could be divided into three equal groups of openings encompassed by arcs, for example arcs between 0° to 120°, between 120° and 240°, and between 240° to 360°. The openings in the first group would have an axis that is substantially parallel to a line that bisect the first arc at 60°, openings in the second arc would have an axis that is substantially parallel to a line that bisect the second arc at 180°, openings of the third group in the third arc would have an axis that is substantially parallel to a line that bisect the third arc at 300°.

Molds for the rotatable base can have a center mandrel to form the bore that mold pins can contact. The mold pins can have the same or different shape. The mold can have two or more plates and each plate of the mold can have mold pins; each mold plate forms a portion of the cylinder shell of the rotatable base or brush core. In embodiments of the invention, the mold pins in a mold plate that form the openings between the surface and bore of the rotatable base have an axis that is approximately or substantially parallel to an axis which bisects the mold plate and lies along the line which allows the mold plates to be radially separated from each other; this is the radial separation axis of the mold plate. The pins of the mold plate have an axis substantially parallel to the radial separation axis of the mold plate. For a two plate mold where the mold halves contact each other at 0° and 180° along a circle describing the rotatable base cross section, the axes which bisect the mold plates and allows the mold plates to be radially separated from each other would lie approximately along lines passing through the circle at 90° and 270°. This is illustrated in FIG. 11 for a two plate mold where the radial separation axes which bisects the mold plate lie along the z axis 1158z in FIG. 11. The mold pins for each plate have axes which are substantially parallel to this z-axis or radial separation axis. In the case of a three plate mold, where the mold plates contact each other at 90°, 210° and 330° along a circle describing the rotatable base cross section, the radial separation axes which bisect the mold plates and allows the three mold plates to be radially separated from each other would lie approximately along lines passing through the circle at 30°, 150° and 270°. For one of the three mold plates the mold pins would have pin axes substantially parallel to the 30° mold plate radial separation axis, the other two mold plates would have pin axes substantially parallel to the 150° and 270° mold plate radial separation axes respectively. Molds having four or more plates could also be similarly configured and used in embodiments of the invention. Depending upon the flexibility of the thermoplastic material and flexibility of the mold pin material, some variation in the parallel orientation of the axis of the mold pins with respect to the radial separation axes may be present; in some embodiments the variation can be less than 10 degrees from parallel, in other embodiments less than 4 degrees, and in still other embodiments less than 1 degree. The less variation, the longer the mold life and better reproducibility of flow characteristics of the rotatable base.

In the case of a two plate mold, the mold for the rotatable base has a center mandrel that mold pins can contact. The mold pins can have the same or different shape. Each side of the mold forms a half cylinder shell of the rotatable base or brush core. The pins in each mold that form the openings have an axis that is approximately or substantially parallel to the z-axis of a plane that divides or separates the two portions of the mold for the rotatable base. The plane includes the rotational axis of the rotatable base or brush core. The mold pins can form openings with and without draft angles in the wall of the rotatable base, and embodiments of the invention can include any combination of openings with and without draft angles that may be made in the rotatable base or brush core with a two piece mold. The axis of the opening can be formed from a two piece mold and thermoplastic material. Depending upon the flexibility of the thermoplastic material and flexibility of the mold pin material, some variation in the parallel orientation of the axis of the mold pins with respect to the z-axis or radial separation axis may be present; in some embodiments the variation can be less than 10 degrees from parallel, in other embodiments less than 4 degrees, and in still other embodiments less than 1 degree. The less variation, the longer the mold life and better reproducibility of flow characteristics of the rotatable base.

Draft angles for the openings facilitate separation of the mold plates from the rotatable base and distribute fluid from the bore to the substrate being treated. Examples of various draft angles (A, B, C) that can be formed in the embodiments of the rotatable base are shown in FIG. 7A-B. Draft angles may be described relative to lines that are approximately tangent to the outer surface of openings in the base. For example $T_1$ and $T_2$ are lines tangent to rotatable base openings 726 and 730 respectively. Lines $P_1$, $P_2$, and $P_3$ are parallel to a wall of openings like 730 or 726. The non-limiting draft angle B is shown relative to lines $T_1$ and $P_2$ and B≠90°. The non-limiting draft angle C is shown relative to lines $T_1$ and $P_1$ and C≠90°. The non-limiting draft angle A is shown relative to lines $T_2$ and $P_3$ and draft angle A is approximately 90°. Embodiments of the invention include openings with at least one draft angle. The draft angle can vary along the circumference of a rotatable base as illustrated by the various openings in FIG. 3. In FIG. 7A, lines $P_1$, $P_2$, and $P_3$ are shown intersecting the plane 758 at right angles. In other embodiment, lines $P_1$, $P_2$, and $P_3$ may be parallel, non-parallel, or any combination of these. Where a line such as $P_4$ in FIG. 11 is parallel to a wall opening, it can intersect the plane 1158 at an angle other than 90°. The axis for the openings such as those in FIG. 7A-B or FIG. 11 lie essentially parallel to the z-axis such as 758a or 1158z that is perpendicular to plane 758 or plane 1158 as shown. One feature of openings that have draft angles is that these openings can have wall portions that have a thickness less than the thickness $W_T$ of the rotatable base 754 wall as illustrated by wall portion 729 of opening 730 in FIG. 7B. Thin wall portions allow larger openings to be formed in the surface of the rotatable base, incorporation of a blowing agent into the material forming the base provides stiffness to the piece and surface texture for bonding.

As illustrated in FIG. 11, pins such as 770 and 764 from the one half of the mold 780 can form openings in a first half of the rotatable base 754, and pin(s) such as 776 from a second half of the mold 784 can form openings in the second half of the rotatable base 754. Openings on the first and second half of the molds can be aligned, staggered or offset from each other. Although FIG. 1 and FIG. 9 illustrate openings that have one or more shapes along the circumference, the openings are not limited to these illustrations and can be the same or different.

Flow uniformity in embodiments of the invention can be determined by applying a fluid to the inlet of device with a porous pad slipped or cast onto a base and applying pressure to the fluid. The rotatable base can be positioned horizontally and containers placed equidistant below it to collect fluid that flows through the openings in the base, through the porous pad, and into the containers. Multiple containers may be used underneath the rotatable base which can vary depending upon the size of the base and the resolution of the flow measurements taken. Where the base include fluid fittings or portions of the base without openings, a subset of the containers may be used to determine the distribution, uniformity, and flow restriction of liquid through the porous pad interlocked with the base. The base, especially in the case of a cylindrical base, can be rotated and measurements taken at various angles such as 0, 90, 180, and 270 degrees with respect to a reference point on the cylinder. An average value of the flow across the containers, and also for the different positions, can be determined. In some embodiments of the invention a uniform or essentially uniform liquid flow deviates by less than about ±30% of the measured average flow at one or more reference points or subset of points across the rotatable base; in some embodiments of the invention a uniform or essentially uniform liquid flow deviates less than about ±20% of the measured average flow at one or more reference points or subset of points across the rotatable base.

Although embodiments of the invention have been described with the porous pad, foam, or sponge material that interlocks with the one or more openings in the base being a polyvinyl acetal based material, the invention is not limited to this material. Other common foam or sponge materials that can be cast or molded onto the rotatable base with openings can be used in embodiments of the invention. The foam or sponge material is selected to distribute liquid to a substrate and is low in particulate matter and or other extractable contaminants. The foam or sponge can have a select pore size or pore size range that can be distributed throughout its volume. Various types of foam materials which may be used include but are not limited to polyvinyl acetal, polyurethane, polyisocyanate, polystyrene, polyolefin, or the like.

Advantageously, embodiments of the invention can be molded using molds that do not require side action to remove a rotatable base from the mold. Molds having multiple plates and side action are expensive and more costly than those which were used or could be used to make embodiments of the present invention. Another advantage of the molded rotatable base of the present invention is the ability to make drive and fluid fittings that do not protrude into the core which can lead to less uniform fluid flow at the ends of the base. Further, the large openings in the rotatable base facilitate the flow and distribution of viscous foam forming precursor mixtures and reagents through the openings in the rotatable base as well as into various portions of the brush forming mold. This provides uniform mold filling and prevents scrap due to voids and incomplete filling.

Various aspects of the present invention will be illustrated with reference to the following non-limiting examples.

EXAMPLE 1

This example illustrates the equalized or essentially uniform flow of a liquid through a porous pad (PVA) cast onto a molded rotatable base from a two piece mold. Flow uniformity was determined by applying a fluid to the inlet of device with a porous pad cast onto a molded rotatable base that had openings with a high void volume (described in Example 2, Base 1) and applying pressure to the fluid. The device was positioned horizontally and containers were place below the device at specific distances to collect fluid that flowed through the porous pad and rotatable base and into the containers.

In Table 1 below, time is in seconds, pressure is in psig and the relative positions of the container given (1-7) along the device. Fluid flow was measured in ml/min for water at room temperature.

TABLE 1

| Time (sec) | Press (psi) | Position (flow (ml/min)) | | | | | | | Avg. (ml/min) (1-6) | Stdev (%) (1-6) |
| --- | --- | --- | --- | --- | --- | --- | --- | --- | --- | --- |
| | | 1 | 2 | 3 | 4 | 5 | 6 | 7 | | |
| 30 | 0.52 | 64.0 | 96.0 | 92.0 | 92.0 | 104.0 | 100.0 | 76.0 | 89 | 15.9 |
| 30 | 0.42 | 68.0 | 100.0 | 92.0 | 84.0 | 104.0 | 96.0 | 68.0 | 87 | 16.8 |
| 30 | 0.61 | 52.0 | 104.0 | 72.0 | 92.0 | 116.0 | 92.0 | 64.0 | 85 | 27.0 |
| 30 | 0.6 | 56.0 | 108.0 | 80 | 96.0 | 116.0 | 96.0 | 64.0 | 88 | 25.3 |
| 25 | 1.42 | 67.2 | 134.4 | 91.2 | 105.6 | 144.0 | 115.2 | 76.8 | 105 | 27.3 |
| 25 | 1.4 | 72.0 | 144.0 | 76.8 | 100.8 | 148.8 | 139.2 | 81.6 | 109 | 31.2 |
| 25 | 1.04 | 81.6 | 115.2 | 96.0 | 81.6 | 110.4 | 134.4 | 100.8 | 103 | 18.4 |

The results of the tests were also used to calculate (pressure, average, percent stdev of average) for the center five container points (positions 2-6). The results of the calculations for the data in the Table are: (0.52, 96.8, 5.4); (0.42, 95.2, 8.10); (0.61, 95.2, 17.2); (0.60, 99.2, 13.8); (1.42, 118.1, 18.1); (1.40, 121.9, 25.9); and (1.04, 107.5, 18.6) respectively.

The results illustrate little or no restriction to fluid flow across the open areas of the base. The results also illustrate that the one or more openings in the rotatable base provide a uniform distribution of fluid from the rotatable base to the outside of the porous pad. The one or more openings in the molded rotatable base provide a uniform and unrestricted distribution of fluid from the rotatable base to the outside of the porous pad.

EXAMPLE 2

This example illustrates void volumes calculated for various embodiments of the invention.

TABLE 2

|  |  | Base 1 | Base 2 | Base 3 |
|---|---|---|---|---|
| Displaced volume (non- |  | 10.68 | 9.46 | 3.97 |
| Section 1 | ID | 0.880 | 0.720 | 0.735 |
|  | OD | 1.390 | 1.320 | 1.000 |
|  | Length | 11.710 | 12.070 | 12.250 |
|  | Vol. | 10.647 | 11.603 | 4.423 |
| Section 2 | ID | 0.500 | 0.500 | 0.500 |
|  | OD | 1.390 | 1.320 | 1.000 |
|  | Length | 0.540 | 0.580 | 0.400 |
|  | Vol. | 0.713 | 0.680 | 0.236 |
| Section 3 | ID | 0 | 0 | 0 |
|  | OD | 1.390 | 1.320 | 1.000 |
|  | Length | 0.153 | 0.280 | 0.469 |
|  | Vol. | 0.231 | 0.383 | 0.368 |
| Section 4 | ID |  | 0.490 |  |
|  | OD |  | 0.925 |  |
|  | Length |  | 0.400 |  |
|  | Vol. |  | 0.193 |  |
| Total |  | 11.592 | 12.859 | 5.027 |
| Void vol. |  | 0.913 | 3.401 | 1.061 |
| Void vol. (%) |  | 8.57 | 29.31 | 23.98 |
| Relative flow channel length |  | 0.255 | 0.300 | 0.133 |

The results in Table 2 show estimated void volumes for various rotatable bases that range from about 8% to about 30%.

EXAMPLE 3

This example illustrates the flow distribution from a porous pad on a rotatable base. The rotatable base has through holes and drive and fluid fittings that intrude into the core. Using the method of Example 2, with wall thickness of 0.204 inches, this device had an approximate calculated void volume of 5%.

TABLE 3

| Time | Press | Position (flow (ml/min)) | | | | | | | Avg. (ml/min) | Stdev (%) |
|---|---|---|---|---|---|---|---|---|---|---|
| (sec) | (psi) | 1 | 2 | 3 | 4 | 5 | 6 | 7 | (1-7) | (1-7) |
| 18 | 2.02 | 76.7 | 100.0 | 146.7 | 153.3 | 170.0 | 93.3 | 86.7 | 118 | 31.7 |
| 20 | 1.15 | 63.0 | 90.0 | 129.0 | 144.0 | 162.0 | 90.0 | 69.0 | 107 | 35.9 |
| 22 | 0.5 | 51.8 | 70.9 | 117.3 | 100.9 | 141.8 | 90.0 | 73.6 | 92 | 33.1 |

Calculating the average for the center five containers in the Table 3 above gave a flow average of 132.7, 123, and 104.2 ml/min for the liquid water pressures of 2.02 psi, 1.15 psi, and 0.5 psi respectively. The standard deviation as a percent of the average for the center five containers was 25.7, 26.3, and 25.9 for the three pressures.

EXAMPLE 4

This example illustrates the equalized or essentially uniform flow of a liquid through a porous pad (PVA) cast onto a molded rotatable base (an embodiment similar to FIG. 9). Flow uniformity was determined by applying a fluid to the inlet of device with a porous pad cast onto a base that had openings with a high void volume and applying pressure to the fluid. The device was positioned horizontally and six containers were place below the device at specific distances to collect fluid that flowed through the porous pad and rotatable base and into the containers.

In the Table 4 below, time is in seconds, liquid water pressure is in psig, and the relative positions of the container given (1-6) along the device. Fluid flow was measured in ml/min for water at room temperature. As illustrated in the embodiment in FIG. 9, the bases surface between flanges (without openings) on the base fluid inlet and drive end portions of the base would result in reduced or no liquid flow. Accordingly, flow data for this example was averaged over the four center collection containers positioned along the base. The results in the table below show an average flow across the open portions of the base (without end point collection container flow) of 208, 216, 326, and 323 ml/min at pressures of 1.63 psi, 1.52 psi, 3.37, and 3.76 psi respectively. The standard deviation as a percent of the average flow ranged from about 9 to about 32 percent.

TABLE 4

| Press | Position (flow(ml/min)) | | | | | | Avg. (ml/min) | Stdev | Stdev (% |
|---|---|---|---|---|---|---|---|---|---|
| (psi) | 1 | 2 | 3 | 4 | 5 | 6 | (2-5) | (2-5) | (2-5) |
| 1.63 | 268.0 | 260.0 | 240.0 | 178.0 | 154.0 | 142.0 | 208.0 | 43.2 | 20.8 |
| 1.52 | 128.0 | 262.0 | 196.0 | 166.0 | 240.0 | 170.0 | 216.0 | 34.7 | 16.0 |
| 3.37 | 196.0 | 314.0 | 284.0 | 346.0 | 362.0 | 228.0 | 326.5 | 30.3 | 9.3 |
| 3.76 | 212.0 | 366.0 | 318.0 | 294.0 | 316.0 | 238.0 | 323.5 | 102.2 | 31.6 |

These results illustrate that there is little flow resistance along the length of the base having the openings. The results also illustrate that the one or more openings in the molded rotatable base with draft angle openings provide a uniform distribution of fluid from the rotatable base to the outside of the porous pad. The one or more openings in the rotatable base provide an essentially uniform and unrestricted distribution of fluid from the rotatable base to the outside of the porous pad.

EXAMPLE 5

This example illustrates the equalized or essentially uniform flow of a liquid through a porous pad (PVA) cast onto a machined rotatable base with one or more openings. Flow uniformity was determined by applying a fluid to the inlet of device with a porous pad cast onto a machined base that had openings with a high void volume and applying pressure to the fluid. The device was positioned horizontally and six containers were placed below the device at specific distances to collect fluid that flowed through the porous pad and rotatable base and into the containers.

The test results are summarized in the Table 5 below where time is in seconds, pressure is in psig and the relative positions of the container given (1-6) along the device. Fluid flow was measured in ml/min for water at room temperature. Due to the possible effect of the inlet fluid fitting and portions of the end of the base without holes used in this example, flow data for this example was averaged over the four center collection containers positioned along the base. The results in the table below show an average flow across the open portions of the base (without end point collection container flow) of about 236, 221, and 188 ml/min at three pressures of 1.4 psi, 1.42 psi, and 1.38 psi respectively. The standard deviation of the liquid flow as a percent of the average ranged from 13 to about 20 percent.

TABLE 5

| Press (psi) | Position (flow(ml/min)) | | | | | | Avg. (ml/min) (2-5) | Stdev (2-5) | Stdev (%) (2-5) |
|---|---|---|---|---|---|---|---|---|---|
| | 1 | 2 | 3 | 4 | 5 | 6 | | | |
| 1.40 | 90.0 | 280.5 | 267.0 | 219.0 | 178.5 | 130.5 | 236.3 | 46.7 | 19.8 |
| 1.42 | 146.0 | 242.0 | 240.0 | 234.0 | 168.0 | 174.0 | 221.0 | 35.5 | 16.1 |
| 1.38 | 133.3 | 152.0 | 188.0 | 209.3 | 202.7 | 122.7 | 188.0 | 25.6 | 13.6 |

These results illustrate that there is little or no flow resistance along the length of the base having openings.

Therefore the spirit and scope of the appended claims should not be limited to the description and the preferred versions contain within this specification.

What is claimed is:

1. A method comprising:
   molding a rotatable base from a moldable thermoplastic material comprising a blowing agent with a mold, said mold having one or more mold plates and said mold plates having one or more mold pins to form one or more openings in the surface of the rotatable base, said rotatable base has a first end, a second end, an inner surface and an outer surface; the inner and outer surfaces of the base interconnected by said one or more openings, said openings distribute a liquid from the inner surface of the rotatable base to the outer surface of the rotatable base, said mold pins have an axis substantially parallel to a separation axis of each said mold plate.

2. The method of claim 1 where the molding is an injection molding process.

3. The method of claim 1 where the one or more rotatable base openings include draft angles.

* * * * *